United States Patent [19]
Jin

[11] Patent Number: 6,125,464
[45] Date of Patent: Sep. 26, 2000

[54] HIGH SPEED BOUNDARY SCAN DESIGN

[75] Inventor: London Jin, San Jose, Calif.

[73] Assignee: Adaptec, Inc., Milpitas, Calif.

[21] Appl. No.: 08/951,987

[22] Filed: Oct. 16, 1997

[51] Int. Cl.[7] .................................................. G01R 31/28
[52] U.S. Cl. .......................................... 714/727; 714/724
[58] Field of Search ...................................... 714/727, 724, 714/726

[56] References Cited

U.S. PATENT DOCUMENTS

| | | | |
|---|---|---|---|
| 4,872,169 | 10/1989 | Whetsel, Jr. | 371/22.3 |
| 4,942,577 | 7/1990 | Ozaki | 371/22.3 |
| 5,084,874 | 1/1992 | Whetsel, Jr. | 371/22.3 |
| 5,130,647 | 7/1992 | Sakashita et al. | 324/158 |
| 5,150,366 | 9/1992 | Bardell, Jr. et al. | 371/22.3 |
| 5,181,191 | 1/1993 | Farwell | 368/113 |
| 5,355,369 | 10/1994 | Greenbergerl et al. | 371/22.3 |
| 5,381,420 | 1/1995 | Henry | 371/22.3 |
| 5,392,296 | 2/1995 | Suzuki | 371/22.3 |
| 5,426,650 | 6/1995 | Ganapathy et al. | 371/22.3 |
| 5,428,622 | 6/1995 | Kuban et al. | 371/22.3 |
| 5,434,804 | 7/1995 | Bock et al. | 364/579 |
| 5,448,575 | 9/1995 | Hashizume | 371/22.3 |
| 5,448,576 | 9/1995 | Russell | 371/22.3 |
| 5,872,908 | 2/1999 | Whetsel | 714/30 |
| 5,991,908 | 11/1999 | Baxter et al. | 714/727 |

OTHER PUBLICATIONS

Unknown, "*IEEE Standard Test Access Port and Boundary--Scan Architecture*", Aug. 17, 1990, IEEE Std 1149.1–1990, Inst. of Electrical and Electronics Engineers, Inc., NY.

V.Agrawal, C. Kime and K. Saluja, "*A Tutorial on Built–In Self–Test*", Jun. 1993, pp. 69–77, Univ. of Wisconsin, Madison.

G.M. Blair, "*Skew–free clock distribution for standard–cell VLSI designs*," Apr. 1992, vol. 139, No. 2, pp. 211–213, Institution of Electrical Engineers, NY.

H. Bakoglu, "*Circuits, Interconnections, and Packaging for VLSI*", 1990, pp. 367–385, Addison–Wesley VLSI System Series.

P. Varma, "*On Path Delay Testing in a Standard Scan Environment*", 1994 IEEE, CrossCheck Technology, Inc., San Jose, CA.

*Primary Examiner*—Phung M. Chung
*Attorney, Agent, or Firm*—Martine Penilla & Kim, LLP

[57] ABSTRACT

An integrated circuit with boundary scan includes core circuitry having at least one system data output. Boundary scan logic is used to control the integrated circuit to operate in a test mode or in a system mode. The boundary scan logic includes a test data line, a shift signal line, and a mode signal line. At least one output boundary scan cell having a boundary scan multiplexer is provided. The boundary scan multiplexer includes a control input coupled to the shift signal line, a first input coupled to receive a system data signal, and a second input coupled to the test data line. The boundary scan cell further includes a first output data register having an input coupled to an output of the boundary scan multiplexer. At least one output cell including an output data multiplexer is also included. The output data multiplexer includes a control input coupled to the mode signal line and includes as inputs the system data output line and an output of the first output data register. The output cell further includes an output buffer coupling an output of the output data multiplexer to a pin of the integrated circuit. In accordance with principles of the present invention, the output boundary scan cell and the output cell are separate from each other.

20 Claims, 18 Drawing Sheets

HIGH SPEED BOUNDARY SCAN DESIGN

BACKGROUND OF THE INVENTION

1. Field of the Invention

This invention relates generally to boundary scan testing of interconnections between integrated circuits.

2. Description of the Related Art

Electronic systems generally include one or more printed circuit boards (PCB's) and one or more integrated circuit chips (IC chips). IC chips typically include input/output pins (I/O pins) which may be coupled to interconnects of a PCB. Testing performance of electronic systems which include PCB's and IC chips typically requires testing at chip level, at board level, and at system level. Testing at board level includes testing interconnects of the PCB. Testing at system level requires analysis of interconnections between IC chips, PCB's, and other devices.

To enhance testability at board level as well as at system level, a common design practice at chip level is to incorporate boundary scan test logic an IC in accordance with IEEE Standard 1149.1. IEEE standard 1149.1 specifies the function of JTAG logic, which is named for the Joint Test Action Group (JTAG), for control of boundary scan testing.

FIG. 1A is a conceptual block diagram of an integrated circuit chip (IC chip) 100. In accordance with IEEE standard 1149.1, prior art boundary scan cells 102 are inserted between core logic 104 and input/output pins (I/O pins) 106 of IC 100. Boundary scan cells 102 are typically inserted for all I/O pins 106 of a plurality of IC chips 100 and may be used to test the integrity of interconnections (not shown) between a plurality of IC chips such as IC chip 100.

IC chip 100 may be controlled by boundary scan logic, in accordance with IEEE standard 1149.1, to operate in a system mode or in a JTAG test mode. In the system mode, system data signals relating to core functions of IC chip 100 are passed through I/O pins 106 to and from devices external to IC chip 100. In the JTAG test mode, test data are provided by the boundary scan chain for the purpose of testing interconnections between IC chip 100 and devices external to IC chip 100. The boundary scan logic also provides test control signals which include mode signals, shift signals, clock signals, and update signals each of which is described below. Shift control signal instructions include a bypass instruction, a sample instruction, and a cross test instruction. The cross test instruction controls boundary scan cells 102 to perform a boundary scan test among IC chips such as IC chip 100.

IC chip 100 further includes a test data input demultiplexer (TDI demultiplexer) 108, a test data output (TDO) multiplexer 110, a bypass register 112, an instruction register 114, an identification register 116, and a TAP controller 118. TDI demultiplexer 108 includes an input 109 coupled to receive a test data signal from boundary scan logic (not shown) which is typically external to IC 100. TDI demultiplexer 108 includes a first output coupled to a test data input (TDI input) of a first boundary scan cell of boundary scan cells 102. Each of boundary scan cells 102 includes a test data input (TDI input) and a test data output (TDO output). Each of boundary scan cells 102 is connected serially from a TDO output to a TDI input to propagate test data signals as is described further below. TDI demultiplexer 108 further includes a second output coupled to an input of core logic 104, a third output coupled to an input to bypass register 112; a fourth output coupled to an input of instruction register 114; and a fifth output coupled to an input of identification register 116.

TDO multiplexer 110 includes an output 111 which is coupled to provide a test data signal to another IC chip 100 or to boundary scan logic. TDO multiplexer 110 further includes: a first input coupled to a TDO output of a boundary scan cell of boundary scan cells 102, a second input coupled to an output of core logic 104; a third input coupled to an output of bypass register 112; a fourth input coupled to an output of instruction register 114, and a fifth input coupled to an output of identification register 116. Identification register 116 includes inputs coupled to outputs of tap controller 118. Tap controller 118 includes inputs coupled to receive a TMS signal, a TCK signal, and a TRST signal from the boundary scan logic.

FIG. 1B is a conceptual block diagram of input/output structures (I/O structures) in an integrated circuit including a two-state I/O structure 120, a three-state I/O structure 130, and a bidirectional I/O structure 140. Each of state I/O structures 120, 130, and 140 provides coupling between core logic 104 and an I/O pin of I/O pins 106.

Two-state I/O structure 120 includes a two-state output buffer 122. A two-state front end system data net 124 provides coupling between a system data output of core logic 104 and an input 122a of two-state output buffer 122. A two-state back end system data net 126 provides coupling between an output 122b of two-state output buffer 122 and an I/O pin of I/O pins 106.

Three-state I/O structure 130 includes a three-state output buffer 132. A three-state front end system data net 134 provides coupling between a system data output 104b of core logic 104 and an input 132a of three-state output buffer 132. A three-state back end system data net 136 provides coupling between an output 132b of three-state output buffer 132 and an I/O pin of I/O pins 106. A three-state control net 138 provides coupling between a three-state system control signal output line 104c of core logic 104 and a control input 132c of three-state output buffer 132.

Bidirectional I/O structure 140 includes a bidirectional buffer 142. Bidirectional buffer 142 includes an output buffer element 144 and an input buffer element 146. A bidirectional control net 148 provides coupling between a bidirectional control signal output line 104d of core logic 104 and a control input 144a of output buffer element 144. A bidirectional front end system data net 150 provides coupling between a system data output 104e of core logic 104 and an input 144a of output buffer element 144. A bidirectional input data net 152 provides coupling between an output 146a of input buffer element 146 and a system data received input 104f of core logic 104. A bidirectional back end system data net 154 provides coupling between an output 144c of output buffer element 144 and an I/O pin of I/O pins 106. Input buffer element 146 includes an input 146b coupled to bidirectional back end system data net 154.

FIG. 1C shows a conceptual block diagram of the input/output structures of FIG. 1B with prior art boundary scan cells inserted therein. According to prior art methods and apparatus for boundary scan testing, prior art boundary scan cells are inserted into the I/O structures 120, 130, and 140 of FIG. 1B by bisecting each front end system data net 124, 134, 150, 152 and each control net 138, 148 (FIG. 1B).

A prior art boundary scan cell (BSC) 160a is inserted into two-state output structure 120a, between core logic 104 and input 122a of three-state output buffer 122. This insertion is accomplished in the prior art by bisecting of two-state front end system data net 124 resulting in a first two-state split system data net 124a and a second two-state split system data net 124b (FIG. 1C). First two-state split system data net 124*a* provides coupling between a system signal input 161 of a prior art BSC 160*a* and system data output 104*a* of core logic 104. Second two-state split system data net 124*b* provides coupling between a system output 162 of prior art BSC 160*a* and input 122*a* of two-state output buffer 122.

Prior art BSC 160 includes a system input line 161 for receiving system signals including system data signals and system control signals from system signal output lines, including system data signal output lines and system control signal output lines, of core logic 104. If BSC 160 is used for control purposes, system input 161 may receive a system control signal from core logic 104. If BSC 160 is used for output, system input line 161 may receive a system data signal from core logic 104. BSC 160 also includes: a system output 162; a test data input (TDI) line 163 which may receive a test data signal from boundary scan logic either directly or via another boundary scan cell; and a test data output (TDO) line 164 for providing test data to boundary scan logic either directly or via another boundary scan cell. BSC 160 further includes a JTAG input 165 which is described further below. BSC's 160*a*, 160*b*, 160*c*, and 160*d* of FIG. 1C are each identical to BSC 160.

A prior art BSC 160*c* is inserted into three-state output structure 130*a*, between system data output 104*c* of core logic 104 and input 132*a* of three-state output buffer 132. This insertion is accomplished in the prior art by bisecting three-state system data net 134 (FIG. 1B) resulting in first three-state split system data net 134*a* and a second three-state split system data net 134*b* (FIG. 1C). First two-state split system data net 134*a* provides coupling between system data output 104*b* of core logic 104 and system input 161 of BSC 160*c*. Second three-state split system data net 134*b* provides coupling between a system output 162 of BSC 160*c* and input 132*a* of three-state output buffer 132. BSC 160*c* serves as an output boundary scan cell in three-state output structure 130. System output 162 of BSC 160*c* provides a system data signal to an I/O pin of I/O pins 106 via three-state split system data net 134*b*.

A prior art BSC 160*b* is inserted into three-state output structure 130*a* between three-state control signal output line 104*c* of core logic 104 and control input 132*c* of three-state output buffer 132. This insertion is accomplished in the prior art by bisecting three-state control net 138 (FIG. 1B) resulting in a first three-state split control net 138*a* and a second three-state split control net 138*b* (FIG. 1C). First three-state split control net 138*a* provides coupling between system input 161 of prior BSC 160*b* and two-state control signal output line 104*c* of core logic 104. Second three-state split system data net 138*b* provides coupling between system output 162 of prior BSC 160*b* and control input 132*c* of three-state output buffer 132. Prior art BSC 160*b* serves as a control boundary scan cell in three-state output structure 130*a*.

A BSC 160*d* is inserted into bidirectional output structure 140*b*, between system control signal output line 104*d* of core logic 104 and prior art bidirectional output buffer 142. This insertion is accomplished in the prior art by bisecting bidirectional control net 148 (FIG. 1B) resulting in a first split bidirectional control net 148*a* and second split bidirectional control net 148*b* (FIG. 1C). First split bidirectional control net 148*a* provides coupling between system control signal output line 104*d* of core logic 104 and system input 161 of BSC 160*d*. Second split bidirectional control net 148*b* provides coupling between system output 162 of BSC 160*d* and control input 144*c* of output buffer element 144. Prior art BSC 160*d* serves as a control boundary scan cell in bidirectional output structure 140*b*.

A prior art bidirectional boundary scan cell (prior art bidirectional BSC) 180 is inserted into bidirectional output structure 140 between core logic 104 and prior art bidirectional output buffer 142. This insertion is accomplished in the prior art by bisecting bidirectional output data net 150 and bidirectional input data net 152 (FIG. 1B). Bisecting bidirectional output data net 150 and bidirectional input data net 152 results in a first bidirectional split output data net 150*a*, a second bidirectional split output data net 150*b*, a first bidirectional split input data net 152*a*, and a second bidirectional split input data net 152*b* (FIG. 1C).

First bidirectional split output data net 150*a* provides coupling between system data output 104*e* of core logic 104 and a system data input 181 of prior art bidirectional BSC 180. Second bidirectional split output data net 150*b* provides coupling between a system data output 182 of prior art bidirectional BSC 180 and input 144*b* of bidirectional output buffer element 144. First bidirectional split input data net 152*a* provides coupling between system data received input 104*f* of core logic 104 and a system data received output 183 of prior art bidirectional BSC 180. Second bidirectional split input data net 152*b* provides coupling between a system data received input 184 of prior art bidirectional BSC 180 and output 146*a* of input buffer element 146.

Inserting boundary scan cells 160*a*–160*d*, and 180 into the I/O structures 120, 130, and 140 of FIG. 1B impacts the timing characteristics of each of I/O structures 120, 130, and 140 while each of I/O structures 120, 130, and 140 operate in the system mode. Specifically, inserting boundary scan cells 160*a*–160*d*, and 180 into the I/O structures 120, 130, and 140 introduces a time delay for signals propagating between core logic 104 and buffers 122, 132, and 142. This time delay problem is further described below. Also, the splitting of each of front end system data nets 124, 134, 150, 152 makes wire estimation difficult in synthesis without layout information and also makes layout difficult to meet system timing requirements as each of the split nets may be critical for layout and design.

FIG. 1D is a conceptual block diagram of a four-bit three-state output structure 130*b* without boundary scan cells inserted therein. Four-bit three-state output structure 130*b* includes four three-state output buffers 132*f*, 132*g*, 132*h*, and 132*i*. Each of three-state output buffers 132*f*, 132*g*, 132*h*, and 132*i* has an input 132*a* coupled respectively to receive a system data output signal from a system data output 104*c*1, 104*c*2, 104*c*3, and 104*c*4 of core logic 104. A three-state control net 138 provides coupling between control signal output line 104*b* of core logic 104 and a control input 132*c* of each of three-state output buffers 132*f*, 132*g*, 132*h*, and 132*i*.

FIG. 1E is a conceptual block diagram of a four-bit three-state output structure 130*c* with prior art output boundary scan cells inserted therein. BSC's 160*f*, 160*g*, 160*h*, and 160*i* are inserted respectively between system data output lines 104*c*1, 104*c*2, 104*c*3, and 104*c*4 of core logic 104 and input 132*a* of prior art three-state output buffers 132*f*, 132*g*, 132*h*, and 132*i*. This insertion is accomplished in the prior art by bisecting each three-state system data net 134 (FIG. 1D) resulting in a first three-state split system data net 134*a* and a second three-state split system data net 134*b* (FIG. 1E) for each of BSC's 160*f*, 160*g*, 160*h*, and 160*i*. Each first two-state split system data net 134*a* provides coupling respectively between a system input 161 of a BSC 160*f*, 160*g*, 160*h*, and 160*i* and a system data output 104*c*1, 104*c*2, 104*c*3, and 104*c*4 of core logic 104. Second three-state split system data net 134*b* provides coupling respectively between a system output 162 of BSC 160*f*, 160*g*, 160*h*, and 160*i* and input 132*a* of three-state output buffers 132*f*, 132*g*, 132*h*, and 132*i*. System output 162 of BSC 160*e* is loaded by four prior art three-state output buffers 132*f*, 132*g*, 132*h*, and 132*i*. A problem arises in the prior art due to this excessive loading.

As shown in FIG. 1D, 104*b* is a driver that provides sufficient drive for driving a 4 bit bus. Consequently, when the design is modified to include the BSC logic as shown in FIG. 1E, the driver 104*b* will necessarily be optimized with more drive than is actually needed, and therefore, resources will be wasted. For example, the drive provided by driver 104 in FIG. 1D included a number of buffers (not shown) that are constructed from many transistor gates, which has a down side of occupying more chip space. It should therefore be appreciated that the prior art design of FIG. 1E is not optimized when the BSC 160*e* is added.

Another problem that arises when BSC 160*e* is added in FIG. 1E, is that the output of BSC 160*e* will not have the same drive strength provided by driver 104*b*. Therefore, BSC 160*e* will not be able to drive additional bits that may be required in a particular design. By way of example, BSC 160*e* may be able to drive 4 bits, but if additional bits are added to a design, the BSC 160*e* will not be able to handle the new drive requirements. To overcome this problem, chip designers have included an additional buffer at the output of the BSC 160*e*, however, this has the detrimental effect of introducing additional delay.

A further problem with the prior art technique of inserting BSC's is that the nets 138, and 134 must be broken into two nets (i.e., 138*a*/138*b* and 134*a*/134*b*), which necessarily increases the number of nets in a design. When happens, it will be more difficult to meet the timing requirements of a particular design. Furthermore, it is usually desired to place the BSC's closer to the output buffers 132, however, this would require a substantial amount of manual labor to individually place each BSC close to each of the output buffers 132.

FIG. 1F is a conceptual block diagram of a four-bit bi-directional I/O structure 140*c* which includes four prior art bidirectional buffers 142*a*, 142*b*, 142*c*, and 142*d*. Bidirectional control net 148 provides coupling between a control output line 104*d* of core logic 104 and a control input 144*a* of output buffer element 144 of each bidirectional buffer 142*a*, 142*b*, 142*c*, and 142*d*. Bidirectional front end system data nets 150 provide coupling respectively between a system data output 104*e*1, 104*e*2, 104*e*3, and 104*e*4 of core logic 104 and input 144*b* of output buffer element 144 of each of bidirectional buffers 142*a*, 142*b*, 142*c*, and 142*d*. Bidirectional input data nets 152 provides coupling respectively between output 146*a* of input buffer element 146 of each of bidirectional buffers 142*a*, 142*b*, 142*c*, and 142*d* and system data received input 104*f*1, 104*f*2, 104*f*3, and 104*f*4 of core logic 104.

FIG. 1G is a conceptual block diagram of a four-bit bi-directional I/O structure 140*d* with prior art bi-directional output boundary scan cells inserted therein. Also shown are a plurality of prior art bidirectional boundary scan cells (prior art bidirectional BSC) 180.

A control BSC 160*j* is inserted into bidirectional output structure 140*d*, between control signal output 104*d* of core logic 104 and prior art bidirectional buffer 142*a*, 142*b*, 142*c*, and 142*d* (FIG. 1F). This insertion is accomplished in the prior art by bisecting bidirectional control net 148 resulting in a first split bidirectional control net 148*a* and second split bidirectional control net 148*b*. First split bidirectional control net 148*a* provides coupling between control data output 104*d* of core logic 104 and a system input 161 of BSC 160*j*. Second split bidirectional control net 148*b* provides coupling between system output 162 of BSC 160*j* and control input 144*a* of output buffer element 144 of prior art bidirectional buffer 142*a*, 142*b*, 142*c*, and 142*d*.

Prior art bidirectional boundary scan cells (prior art bidirectional BSC's) 180*b*, 180*c*, 180*d*, and 180*e* are inserted respectively between core logic 104 and bidirectional buffers 142*a*, 142*b*, 142*c*, and 142*d*. First bidirectional split output data nets 150*a* provide coupling respectively between system a data output 104*e*1, 104*e*2, 104*e*3, and 104*e*4 of core logic 104 and a system data input 181 of bidirectional BSC's 180*b*, 180*c*, 180*d*, and 180*e*. Second bidirectional split output data nets 150*b* provide coupling respectively between system data output 182 of bidirectional BSC's 180*b*, 180*c*, 180*d*, and 180*e* and input 144*b* of a bidirectional output buffer element 144 of a bidirectional output buffers 142*a*, 142*b*, 142*c*, and 142*d*.

First bidirectional split input data nets 152*a* provide coupling respectively between a system data received input 104*f*1, 104*f*2, 104*f*3, and 104*f*4 of core logic 104 and a system data received output 183 of bidirectional BSC's 180*b*, 180*c*, 180*d*, and 180*e*. Second bidirectional split input data nets 152*b* provide coupling respectively between a system data received input 184 of bidirectional BSC's 180*b*, 180*c*, 180*d*, and 180*e* and an output 146*a* of an input buffer element 146 of a bidirectional output buffer 142*a*, 142*b*, 142*c*, and 142*d*.

FIG. 2 is a detailed logic block diagram of prior art BSC 160. Prior art BSC 160 includes system data input line 161 for receiving a system data signal or a system control signal from core logic 104 (FIG. 1A). Prior art BSC 160 also includes BSC output line 162, test data input (TDI) line 163, and test data output (TDO) line 164.

Prior art BSC 160 further includes a JTAG input 165. JTAG input 165 includes a mode signal input line 202, a shift signal input line 204, a clock signal input line 206, and an update signal input line 208. Mode input line 202 is coupled to receive a mode signal from boundary scan logic via JTAG bus 105. Shift signal input line 204 is coupled to receive a shift signal from boundary scan logic via JTAG bus 105. Clock signal input line 206 is coupled to receive a clock signal from boundary scan logic via JTAG bus 105. Update signal input line 208 is coupled to receive an update signal from boundary scan logic via JTAG bus 105.

Prior art BSC 160 includes a boundary scan mode multiplexer (mode multiplexer) 220, a shift multiplexer 230, a data shift register 240, and an update data register 250. Mode multiplexer 220 further includes a system input 222, an update input 224, an output 226, and a control line 228. System input 222 of mode multiplexer 220 is coupled to receive a system signal via system input line 161. Update input 224 of mode multiplexer 220 is coupled to receive a signal from an inverted output 256 of update data register 250. Output 226 of mode multiplexer 220 is coupled to provide an output signal to BSC output line 162.

With reference back to FIG. 1E, system output 162 of BSC 160*e* is loaded by four prior art three-state output buffers 132*f*, 132*g*, 132*h*, and 132*i* when BSC 160*e* is used for control BSC. A problem arises in the prior art due to this excessive loading. Because output 226 of mode multiplexer 220 is coupled to provide an output signal to BSC output line 162, output 226 of mode multiplexer 220 may be excessively loaded in the case of four-bit three-state output structure 130*c* of FIG. 1E. Due to the multiplexer 220, there is one mux-delay in system mode.

Control line 228 of mode multiplexer 220 is coupled to receive a mode signal via mode signal input line 202. As mentioned above, BSC mode multiplexer 220 introduces a one-multiplexer time delay for signals propagating between core logic 104 and buffers 122, 132, and 142. Prior art shift multiplexer 230 includes a system input 232, a test data input 234, an output 236, and a control line 238. System input 232 is coupled to receive a system signal via system input line 161. Test input 234 is coupled to receive a test data signal via TDI line 163. Output 236 is coupled to provide a signal to a data input 242 of prior art data shift register 240. Control line 238 is coupled to receive the shift signal via shift signal input line 204. Data shift register includes a data input 242, a clock input 244, a normal output 246, and an inverted output 248. Clock input 244 of data shift register 240 is coupled to receive a clock signal via clock signal input line 206. Normal output 246 of data shift register 240 is coupled to provide a test data signal to TDO line 164. Inverted output 248 is coupled to provide a signal to a data input line 252 of update data register 250. Update data register 250 includes a data input 252, a toggle input 254, and an inverted output 256. Update input 254 is coupled to receive an update signal via update signal input line 208.

FIG. 3 is a detailed logic block diagram of a prior art bi-directional boundary scan cell (prior art bi-directional BSC) 180. As described above, prior art bidirectional BSC 180 includes a system data input line 181, a system data output line 182, system data received output 183, a system data received input 184, a test data input (TDI) line 185, a test data output (TDO) line 186, and a JTAG input 187. System data received output 183 is coupled to system data output line 182. JTAG input 187 includes a shift signal input line 302, a clock signal input line 304, and an update signal input line 306. Shift signal input line 302 is coupled to receive a shift signal from boundary scan logic via JTAG bus 105. Clock data input line 304 is coupled to receive a clock signal from boundary scan logic via JTAG bus 105. Update signal input line 306 is coupled to receive an update signal from boundary scan logic via JTAG bus 105. Prior art bidirectional BSC 180 includes a bidirectional system multiplexer 320, a direction control multiplexer 330, a bidirectional shift control multiplexer 340, a bidirectional data shift register 350, and a bidirectional update data register 360.

A system data input 322 of bi-directional system multiplexer 320 is coupled to receive a system data signal via system data input 181 of prior art bidirectional BSC 180. An update input 324 of bidirectional system multiplexer 320 is coupled to receive a signal from an inverted output 366 of bidirectional update data register 360. An output 326 of bi-directional system multiplexer 320 is coupled to provide a signal to system data output line 182 of prior art bidirectional BSC 180.

A system data input 332 of direction control multiplexer 330 is coupled to receive a system data signal via system data input line 181 of bidirectional BSC 180. A system data received input 334 of direction control multiplexer 330 is coupled to receive the system data received signal via system data received input 184 of prior art bidirectional BSC 180. An output 336 of direction control multiplexer 330 is coupled to provide a signal to a data input 342 of bidirectional shift control multiplexer 340. A control line 338 of direction control multiplexer 330 is coupled to receive a directional control signal via direction control input 188.

A test data input (TDI) 344 of bidirectional shift control multiplexer 340 is coupled to receive a test data signal via TDI input 185 of prior art bidirectional BSC 180. An output 346 of bidirectional shift control multiplexer 340 is coupled to provide a signal to a data input 352 of bidirectional data shift register 350. A control line 348 of bidirectional shift control multiplexer 340 is coupled to receive a shift signal via shift signal input line 302 of prior art bidirectional BSC 180. A clock input 354 of bi-directional data shift register 350 is coupled to receive a clock signal via clock signal input 304 of prior art bidirectional BSC 180. A normal output 356 of bi-directional data shift register 350 is coupled to provide a test data out signal to TDO output 186 of prior art bidirectional BSC 180. An inverted output 358 of bi-directional data shift register 350 is coupled to provide a signal to a data input 362 of bi-directional update data register 360. An update input 364 of bi-directional update data register 360 is coupled to receive an update signal via update input 306 of prior art bidirectional BSC 180.

With reference back to FIG. 1C, inserting boundary scan cells 160, 170, and 180 into the I/O structures 120, 130, and 140 introduces a time delay for signals propagating between core logic 104 and buffers 122, 132, and 142. With reference to FIGS. 2 and 3, it can be seen that the time delay introduced in each case is a one-multiplexer time delay.

What is needed is a method and apparatus for insertion of boundary scan test logic into cells of an integrated circuit such that no splitting of front end system data interconnects is required for insertion of boundary scan cells. What is also needed is a method and apparatus for insertion of boundary scan cells into an integrated circuit wherein timing delays associated with multiplexers in boundary scan cells may be alleviated. What is further needed is a method and apparatus for insertion of boundary scan cells into an integrated circuit wherein problems associated with layout and wire estimation in synthesis and timing analysis may be alleviated.

SUMMARY OF THE INVENTION

In accordance with principles of the present invention a method and apparatus for insertion of boundary scan cells in an integrated circuit is provided. An integrated circuit includes core circuitry having at least one system data output. Boundary scan logic is used to control the integrated circuit to operate in a test mode or in a system mode. The boundary scan logic includes a test data line, a shift signal line, and a mode signal line.

Integrated circuits with boundary scan, according to principles of the present invention, further include at least one output boundary scan cell having a boundary scan multiplexer. The boundary scan multiplexer includes a control input coupled to the shift signal line, a first input coupled to receive a system data signal, and a second input coupled to the test data line. The boundary scan cell further includes a first output data register having an input coupled to an output of the boundary scan multiplexer.

Integrated circuits with boundary scan, according to principles of the present invention, further include at least one output cell including an output data multiplexer. The output data multiplexer includes a control input coupled to the mode signal line and includes as inputs the system data output line and an output of the first output data register. The output cell further includes an output buffer coupling an output of the output data multiplexer to a pin of the integrated circuit. In accordance with principles of the present invention, the output boundary scan cell and the output cell are separate from each other.

For three-state output structures and bi-directional output structures of the integrated circuit, the core circuitry provides at least one system control output line. Also for three-state output structures and bidirectional output structures of the integrated circuit, at least one control boundary scan cell is provided in accordance with principles of the present invention. The control boundary scan cell includes a control boundary scan multiplexer having a control input coupled to the shift signal line. The control boundary scan multiplexer further includes a first input coupled to the system control output line and a second input coupled to the test data line. The control boundary scan cell further includes a first control data register, having an input coupled to an output of the control boundary scan multiplexer, and a second control data register having an input coupled to an inverted output of the first control data register. The control boundary scan cell also includes a control driver having an input coupled to an inverted output of the second control data register.

For three-state output structures, the output cell further includes an output control multiplexer having a control input coupled to the mode signal line. The output control multiplexer further includes as inputs the system control signal line and an output of the control driver. For the three-state output structure, the output buffer of the output cell includes a control input coupled to an output of the output control multiplexer. For the three-state output structure, the system data signal is provided by the system data output line.

For bidirectional output structures of an integrated circuit, a bidirectional boundary scan cell is provided. The bidirectional boundary scan cell includes the above recited elements of the output boundary scan cell. The bidirectional boundary scan cell further includes a direction control multiplexer having a control input coupled to an output of the control driver. A first input of the direction control multiplexer is coupled to the system data output line and a second input of the direction control multiplexer is coupled to receive a system data input signal received from the pin of the integrated circuit. For the bi-directional output structure, an output of the direction control multiplexer provides the system data signal which is received by the first input of the output boundary scan multiplexer.

Also for bi-directional output structures, the output cell further includes an output control multiplexer having a control input coupled to the mode signal line. A first input of the output control multiplexer is coupled to the system control signal line. A second input of the output control multiplexer is coupled to an output of the control driver. An input buffer of the output cell has an input coupled to the pin of the integrated circuit. The output buffer of the output cell includes a control input coupled to an output of the output control multiplexer.

These and other advantages of the present invention will become apparent upon reading the following detailed descriptions and studying the various figures of the drawings.

DETAILED DESCRIPTION OF THE PREFERRED EMBODIMENTS

Figure 4A:
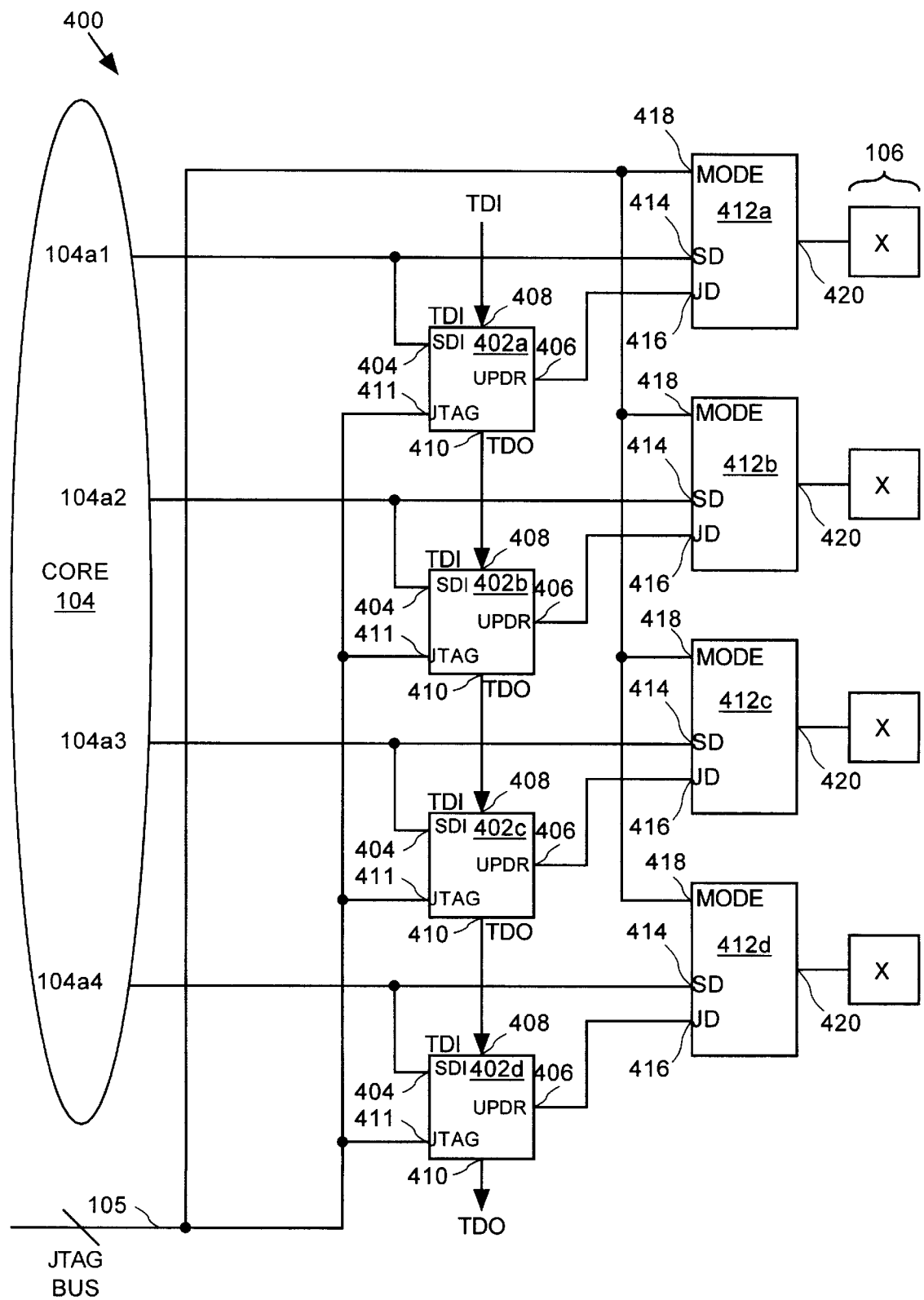
FIG. 4A is a detailed logic block diagram of a four-bit two-state I/O structure including boundary scan cells and output cells in accordance with an embodiment of the present invention.

FIG. 4A is a detailed logic block diagram of a four-bit two-state I/O structure 400 including boundary scan cells and output cells in accordance with an embodiment of the present invention. Four-bit two-state I/O structure 400 includes four identical boundary scan cells (BSC') 402a, 402b, 402c, and 402d in accordance with principles of the present invention. Four-bit two-state I/O structure 400 further includes four identical two-state output cells 412a, 412b, 412c, and 412d in accordance with principles of the present invention.

Each BSC 402 includes a system data input line 404, a system data output line 406, a test data input (TDI) line 408, a test data output (TDO) line 410, and a JTAG input 411. Each of two-state output cells 412a, 412b, 412c, and 412d includes a system data input line 414, a test data input line 416, a mode signal input line 418, and an output line 420.

System data input line 404 of each BSC 402a, 402b, 402c, and 402d is coupled respectively to receive a system data signal from a system data output line 104a1, 104a2, 104a3, and 104a4 of core logic 104. System data output line 406 of each BSC 402a, 402b, 402c, and 402d is coupled respectively to provide a signal to test input 416 of two-state output cell 412a, 412b, 412c, and 412d.

TDI line 408 of BSC 402a is coupled to receive a test data signal from boundary scan logic (not shown). TDI line 408 of each of BSC's 402b, 402c, and 402d is coupled respectively to receive a test data signal from TDO line 410 of BSC's 402a, 402b, and 402c. TDO line 410 of BSC 402d is coupled to provide a test data signal to boundary scan logic (not shown). JTAG input 411 of each BSC 402a, 402b, 402c, and 402d is coupled to JTAG bus 105.

System data input 414 of each two-state output cell 412a, 412b, 412c, and 412d is coupled respectively to receive a system data signal from system data output lines 104a1, 104a2, 104a3, and 104a4 of core logic 104. Mode input 418 of each two-state output cell 412a, 412b, 412c, and 412d is coupled to receive a mode signal via JTAG bus 105. Output 420 of each two-state output cell 412a, 412b, 412c, and 412d is coupled to provide a data signal to an I/O pin of I/O pins 106.

Figure 4B:
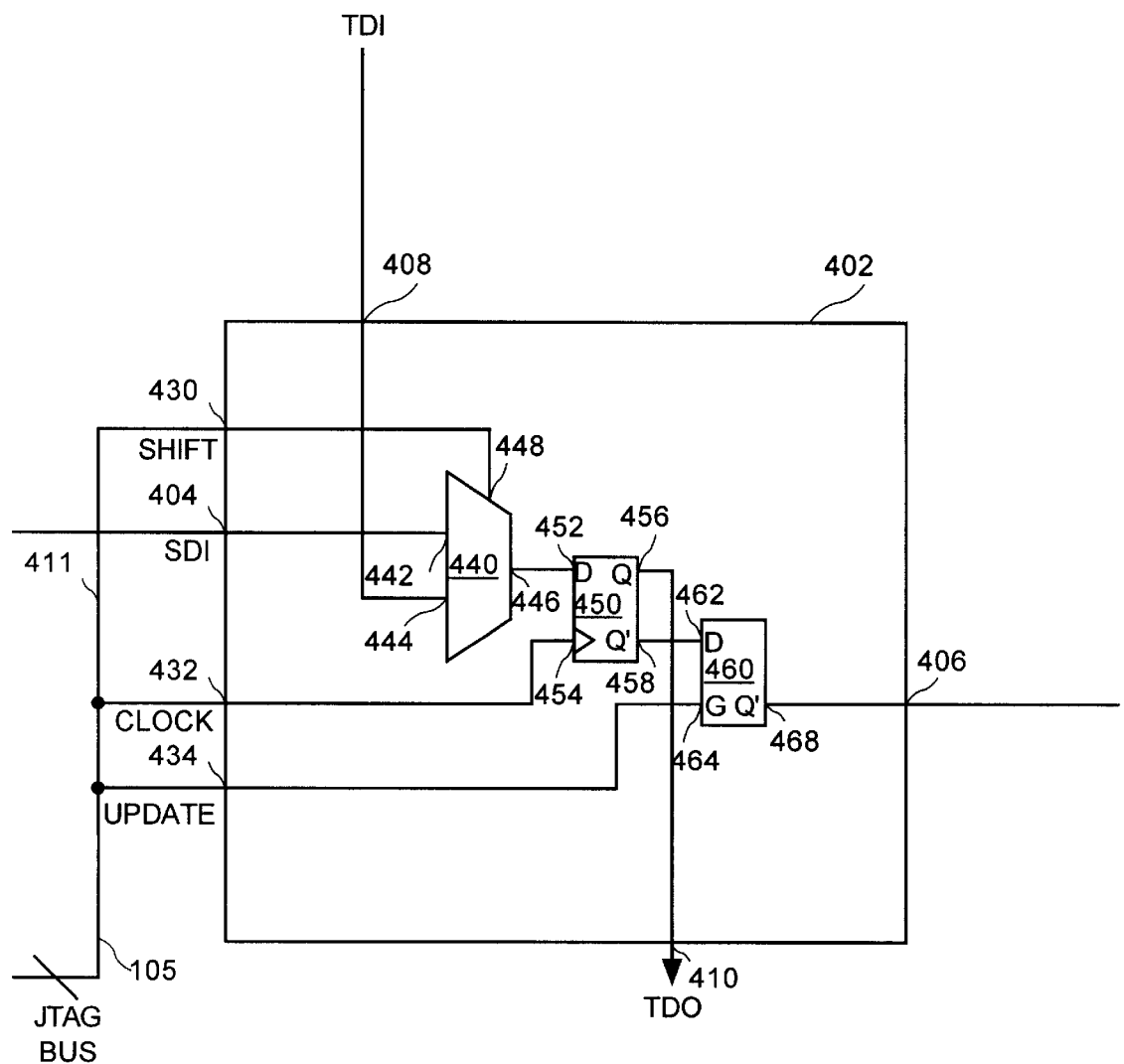
FIG. 4B is a logic block diagram of an output boundary scan cell in accordance with an embodiment of the present invention.

FIG. 4B is a logic block diagram of a boundary scan cell (BSC) 402 in accordance with an embodiment of the present invention. BSC's 402a, 402b, 402c, and 402d of FIG. 4A are each identical to BSC 402 of FIG. 4B. As described above, each BSC 402 includes system data input line 404, system data output line 406, test data input (TDI) line 408, test data output (TDO) line 410, and JTAG input 411. JTAG bus input 411 of BSC 402 includes a shift signal input line 430, a clock signal input line 432, and an update signal input line 434. Shift signal input line 430 is coupled to receive a shift signal from boundary scan logic via JTAG bus 105. Clock signal input line 432 is coupled to receive a clock signal from boundary scan logic via JTAG bus 105. Update signal input line 434 is coupled to an update signal from boundary scan logic via JTAG bus 105. BSC 402 includes a boundary scan cell shift multiplexer (BSC shift multiplexer) 440, a boundary scan cell clock data register (BSC clock data register) 450, and a boundary scan cell update data register (BSC update data register) 460.

A system data input 442 of BSC shift multiplexer 440 is coupled to receive a system data signal via system data input 404 of BSC 402. A test data input 444 of BSC shift multiplexer 440 is coupled to receive a test data signal via TDI input 408 of BSC 402. An output 446 of BSC shift multiplexer 440 is coupled to provide a signal to a data input 452 of BSC clock data register 450. A control line 448 of BSC shift multiplexer 440 is coupled to receive a shift signal via shift signal input line 430 of BSC 402.

A clock signal input 454 of BSC clock data register 450 is coupled to receive a clock signal via clock signal input line 432 of BSC 402. A normal output 456 of BSC clock data register 450 is coupled to provide a test data signal to test data output line 410 of BSC 402. An inverted output 458 of BSC clock data register 450 is coupled to provide a signal to a data input 462 of BSC update data register 460. A toggle input 464 of BSC update data register 460 is coupled to receive an update signal via update signal input 434 of BSC 402. An inverted output 468 of BSC update data register 460 is coupled to provide a BSC output signal to output 406 of BSC 402.

Figure 4C:
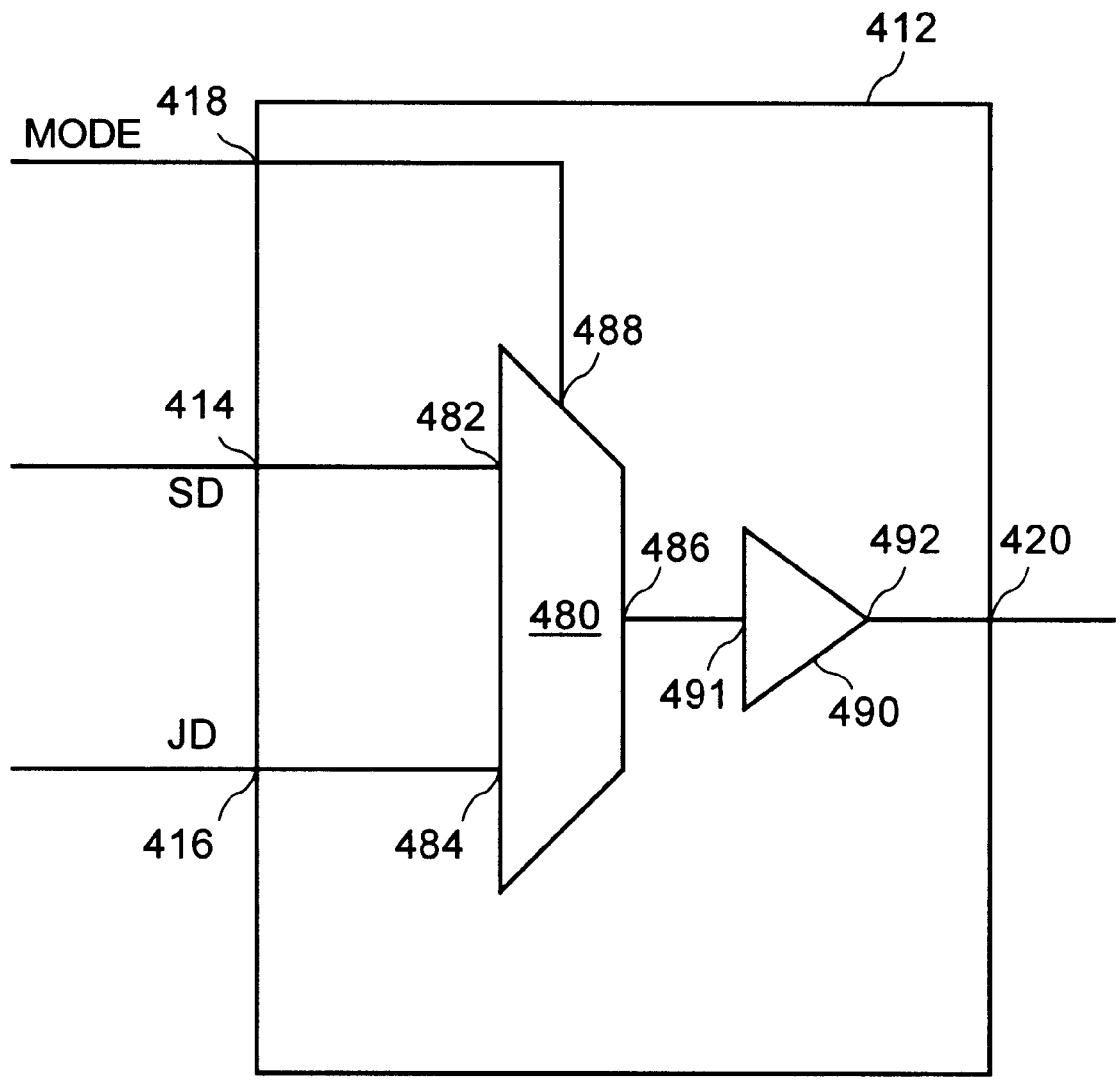
FIG. 4C is a detailed logic block diagram of a two-state output buffer cell in accordance with an embodiment of the present invention.

FIG. 4C is a detailed logic block diagram of a two-state output buffer cell 412 in accordance with an embodiment of the present invention. Each two-state output cell 412a, 412b, 412c, and 412d of FIG. 4A is identical to two-state output cell 412 of FIG. 4C. Two-state output cell 412 includes system data input 414, test data input 416, mode signal input 418, and output 420. Two-state output cell 412 further includes a two-state output multiplexer 480 and a two-state output driver 490.

A system data input 482 of two-state output multiplexer 480 is coupled to receive a system data signal via system data input 414 of two-state output cell 412. A test data input 484 of two-state output multiplexer 480 is coupled to receive a test data signal via test data input 416 of two-state output cell 412. An output 486 of two-state output multiplexer 480 is coupled to provide a signal to an input 491 of two-state output driver 490. A control line 488 of two-state output multiplexer 480 is coupled to receive a mode signal via mode signal input 418 of two-state output cell 412. An output 492 of two-state output driver 490 is coupled to provide an output signal to system data output line 420 of two-state output cell 412.

The presence of two-state output multiplexer 480 in two-state output cell 412 provides an advantage over prior art boundary scan test methods in that no splitting of a front end interconnect is required for insertion of boundary scan cells. With reference back to FIG. 4A, there is no bisecting of the front end data interconnects coupling system data input 414 of each two-state output cell 412a, 412b, 412c, and 412d to system data output lines 104a1, 104a2, 104a3, and 104a4 of core logic 104. Therefore, methods according to the present invention eliminate certain problems associated with layout and wire estimation is synthesis. Also, the presence of two-state output multiplexer 480 in two-state output cell 412 (and absence of a multiplexer inserted to separate the front end data interconnects coupling system data input 414 of each two-state output cell 412a, 412b, 412c, and 412d to system data output lines 104a1, 104a2, 104a3, and 104a4 of core logic 104) provides an advantage over prior art boundary scan test methods in that multiplexer delay may be minimized.

Figure 1A:
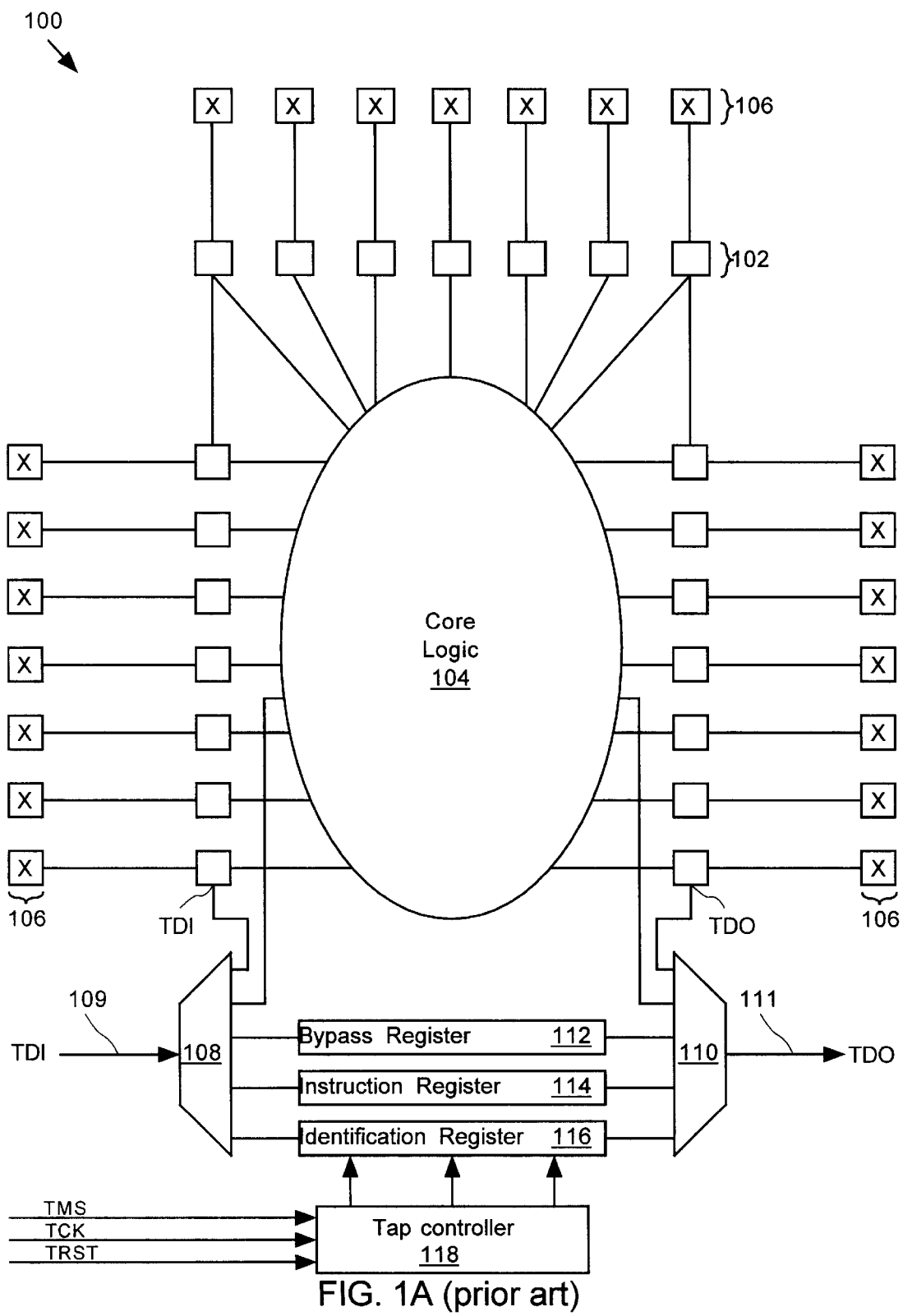
FIG. 1A is a conceptual block diagram of an integrated circuit including prior art boundary scan cells inserted between core logic and input/output pins.
Figure 1B:
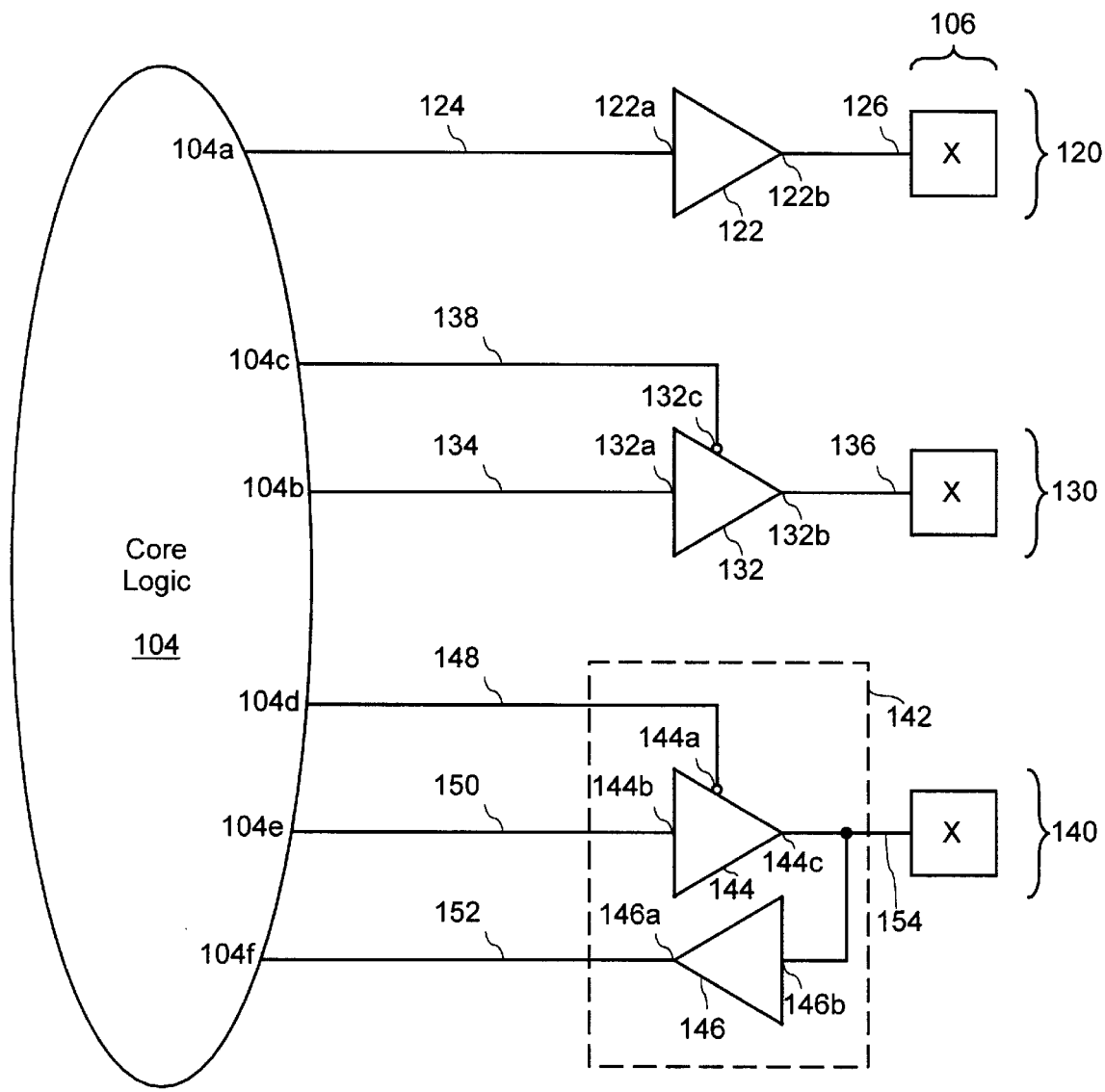
FIG. 1B is a conceptual block diagram of input/output (I/O) structures in an integrated circuit including a two-state I/O structure, a three-state I/O structure, and a bidirectional I/O structure.
Figure 1C:
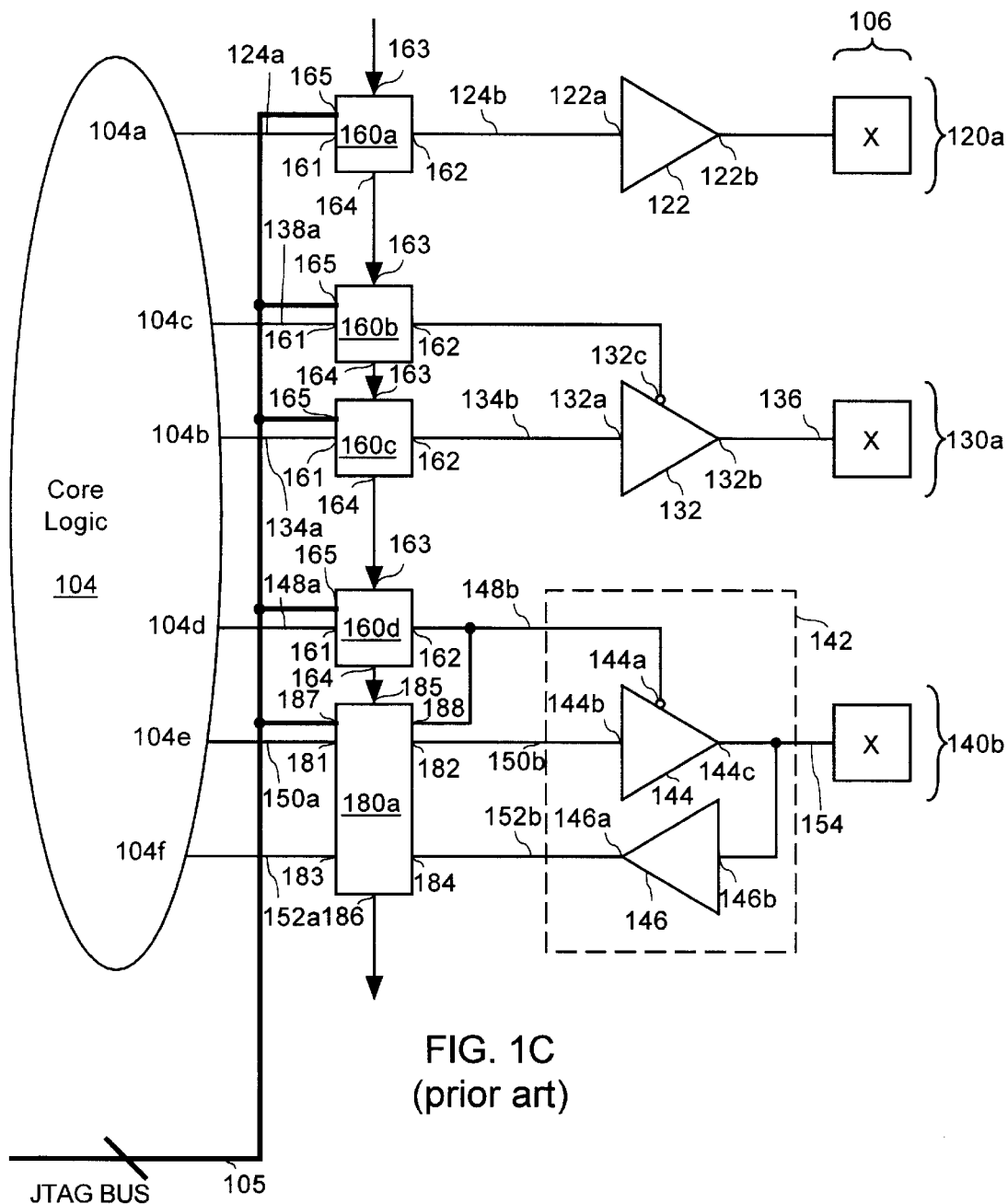
FIG. 1C is a conceptual block diagram of the input/output structures of FIG. 1B with prior art boundary scan cells inserted therein.
Figure 1D:
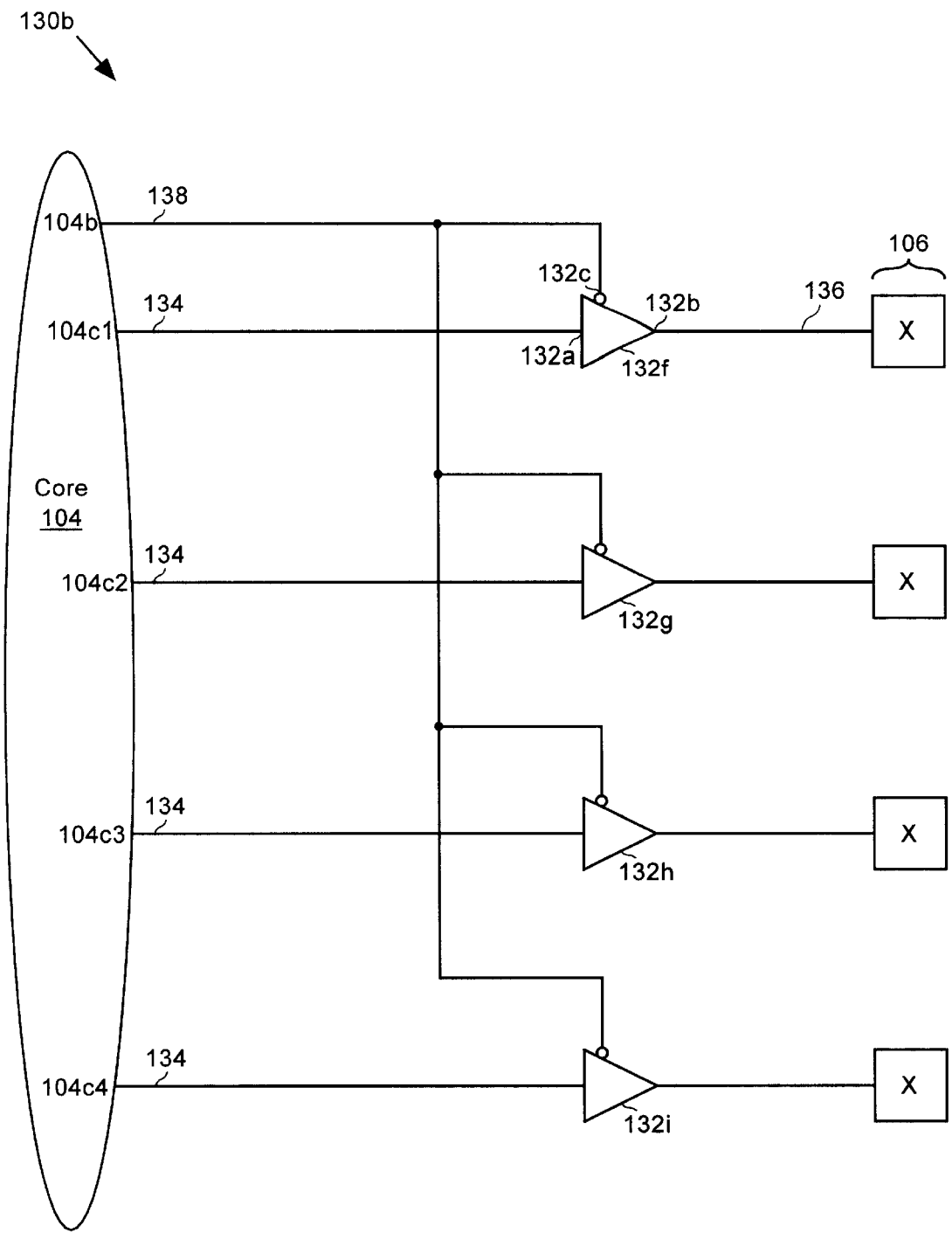
FIG. 1D is a conceptual block diagram of a four-bit three-state output structure without boundary scan cells inserted therein.
Figure 1E:
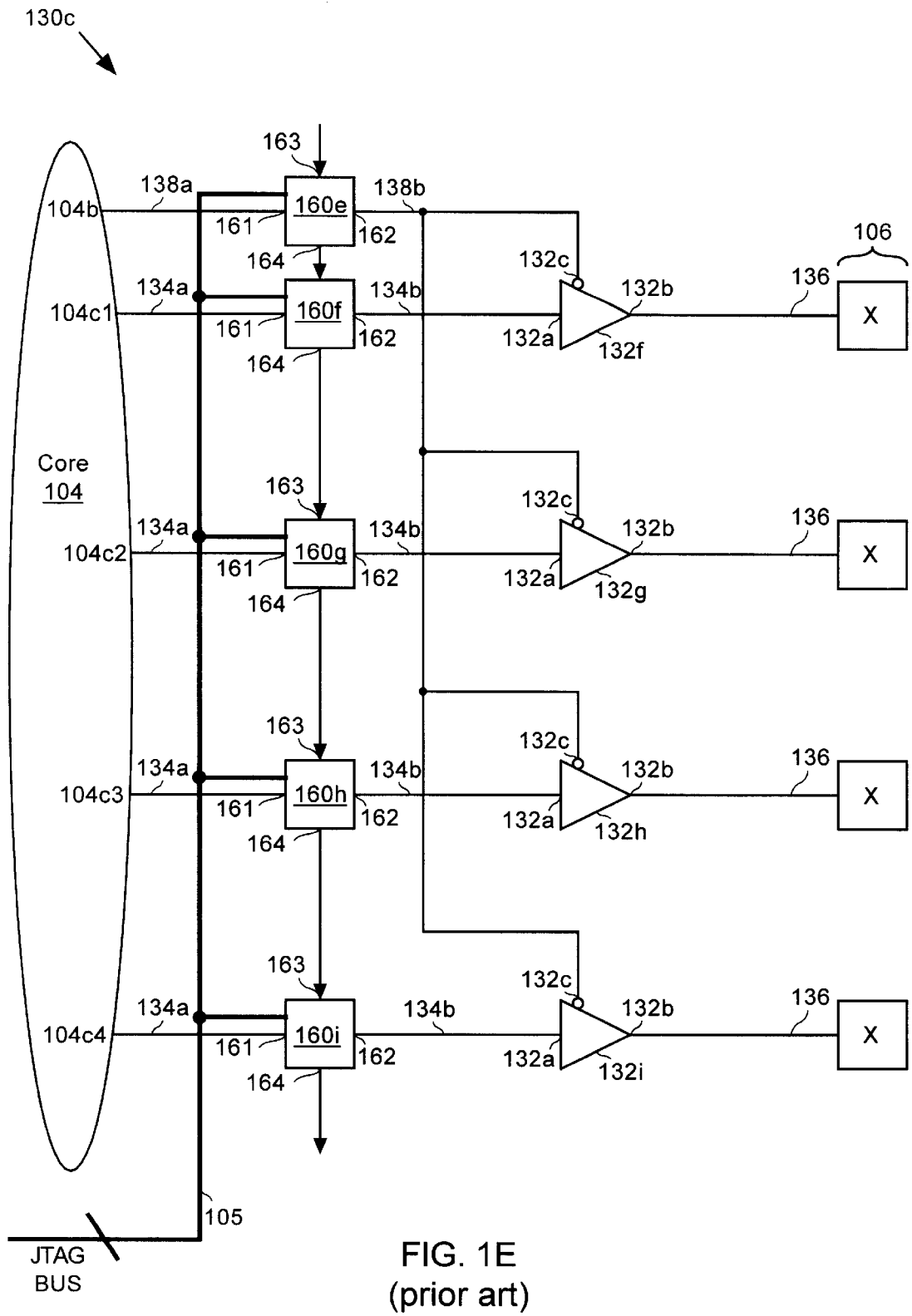
FIG. 1E is a conceptual block diagram of a four-bit three-state output structure with prior art output boundary scan cells inserted therein.
Figure 1F:
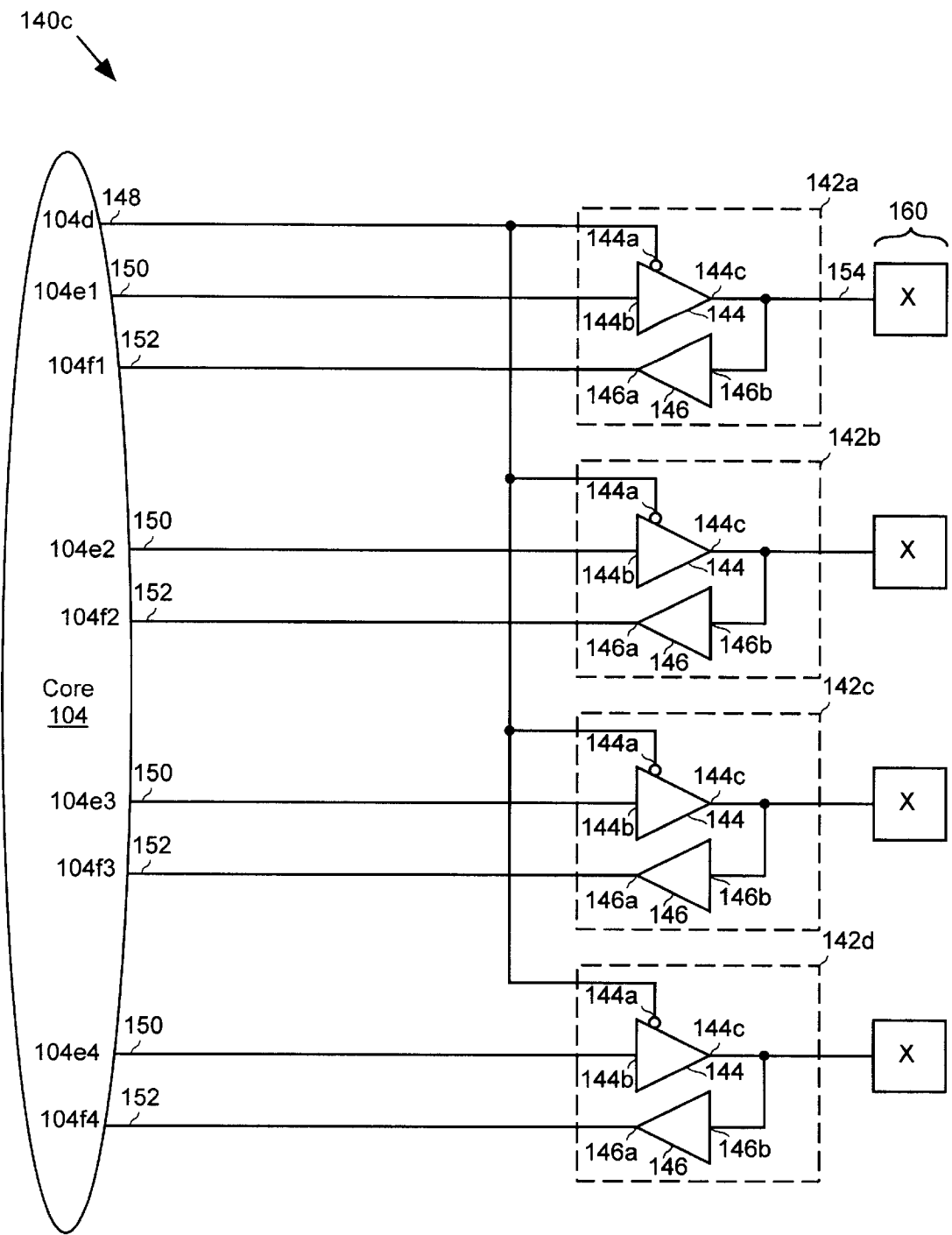
FIG. 1F is a conceptual block diagram of a four-bit bi-directional I/O structure without boundary scan cells inserted therein.
Figure 1G:
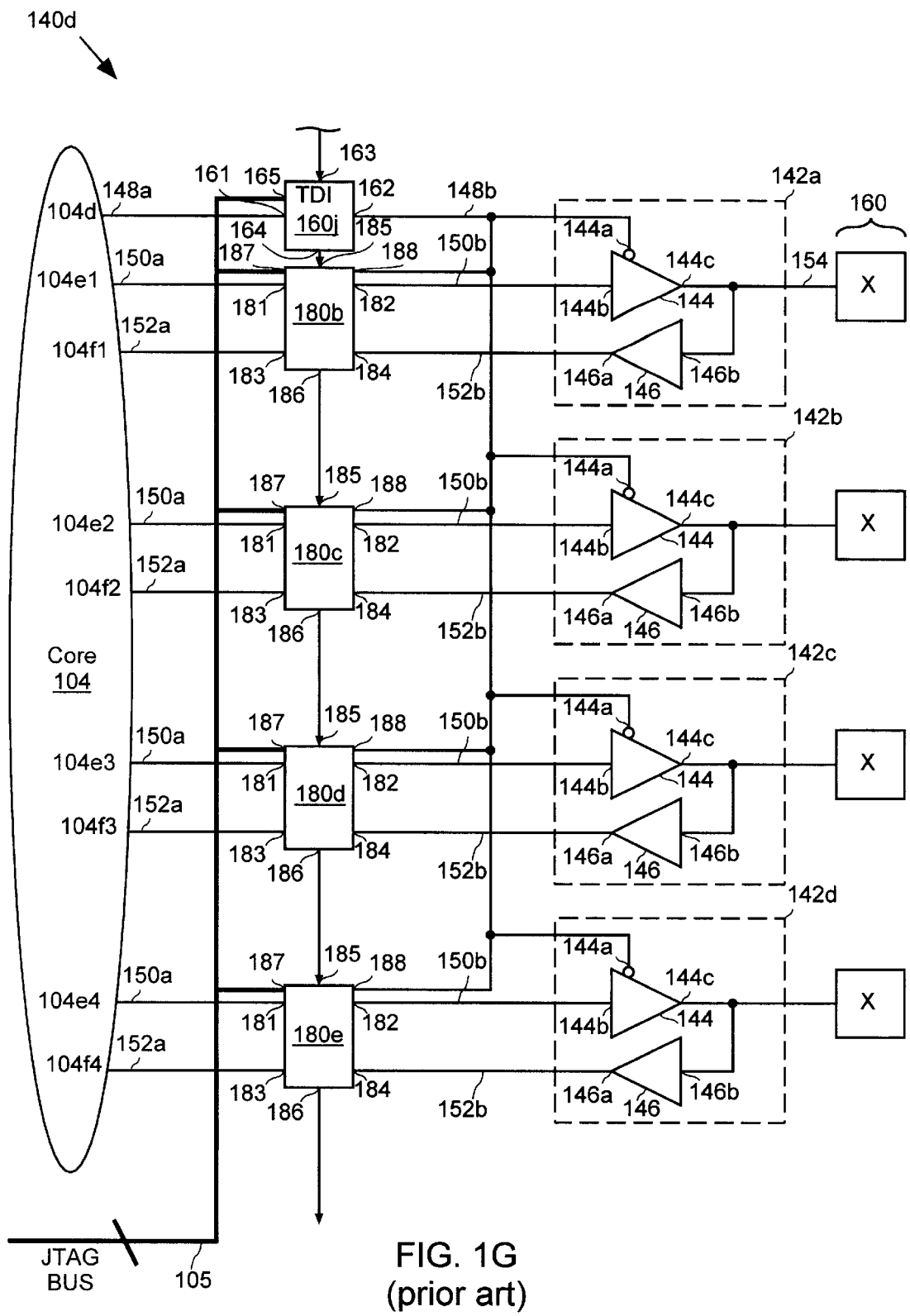
FIG. 1G is a conceptual block diagram of a four-bit bi-directional I/O structure with prior art boundary scan cells inserted therein.
Figure 2:
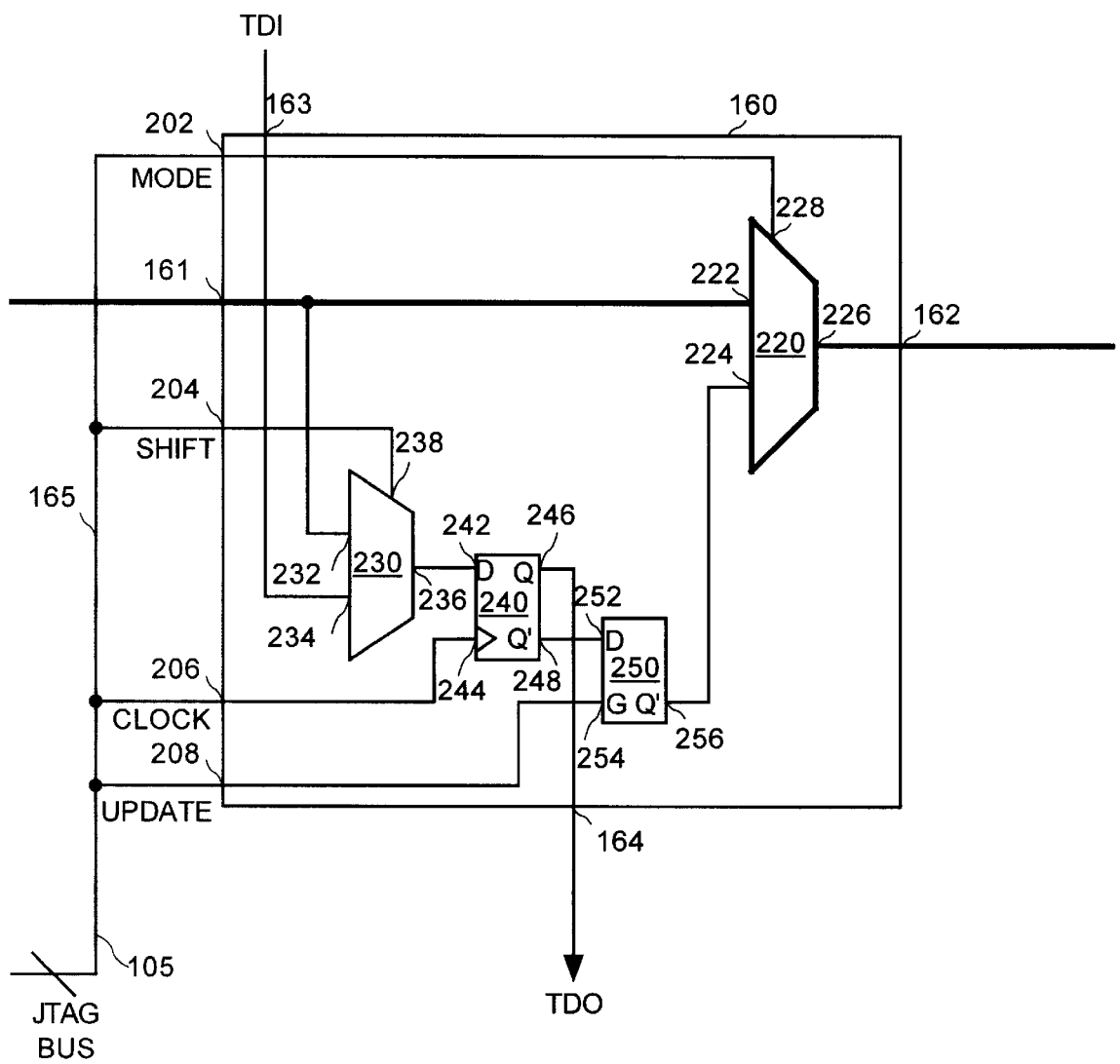
FIG. 2 is a block diagram of a prior art boundary scan cell used for both output and control purposes.
Figure 3:
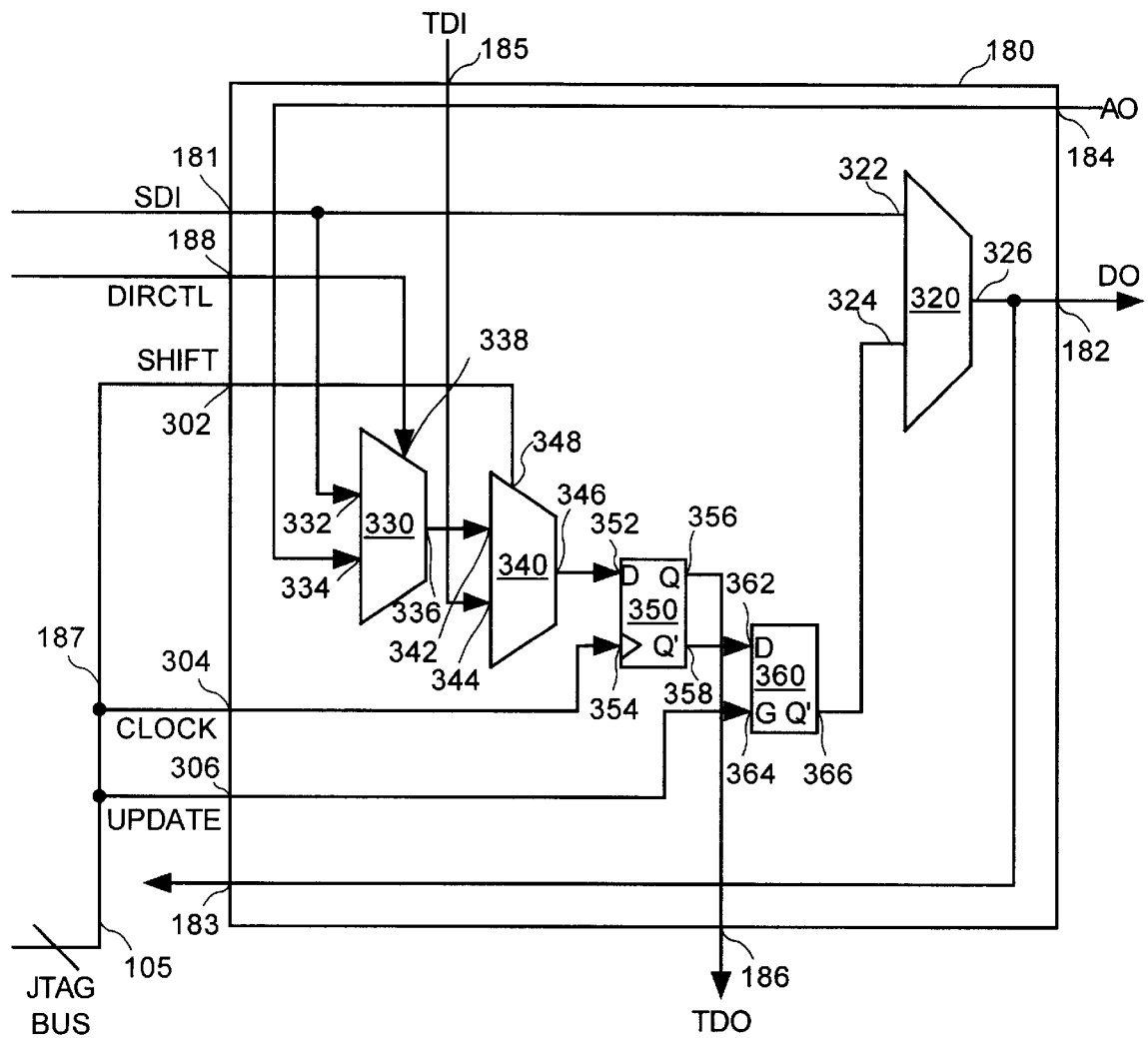
FIG. 3 is a detailed logic block diagram of a prior art bi-directional output bound scan cell.
Figure 5A:
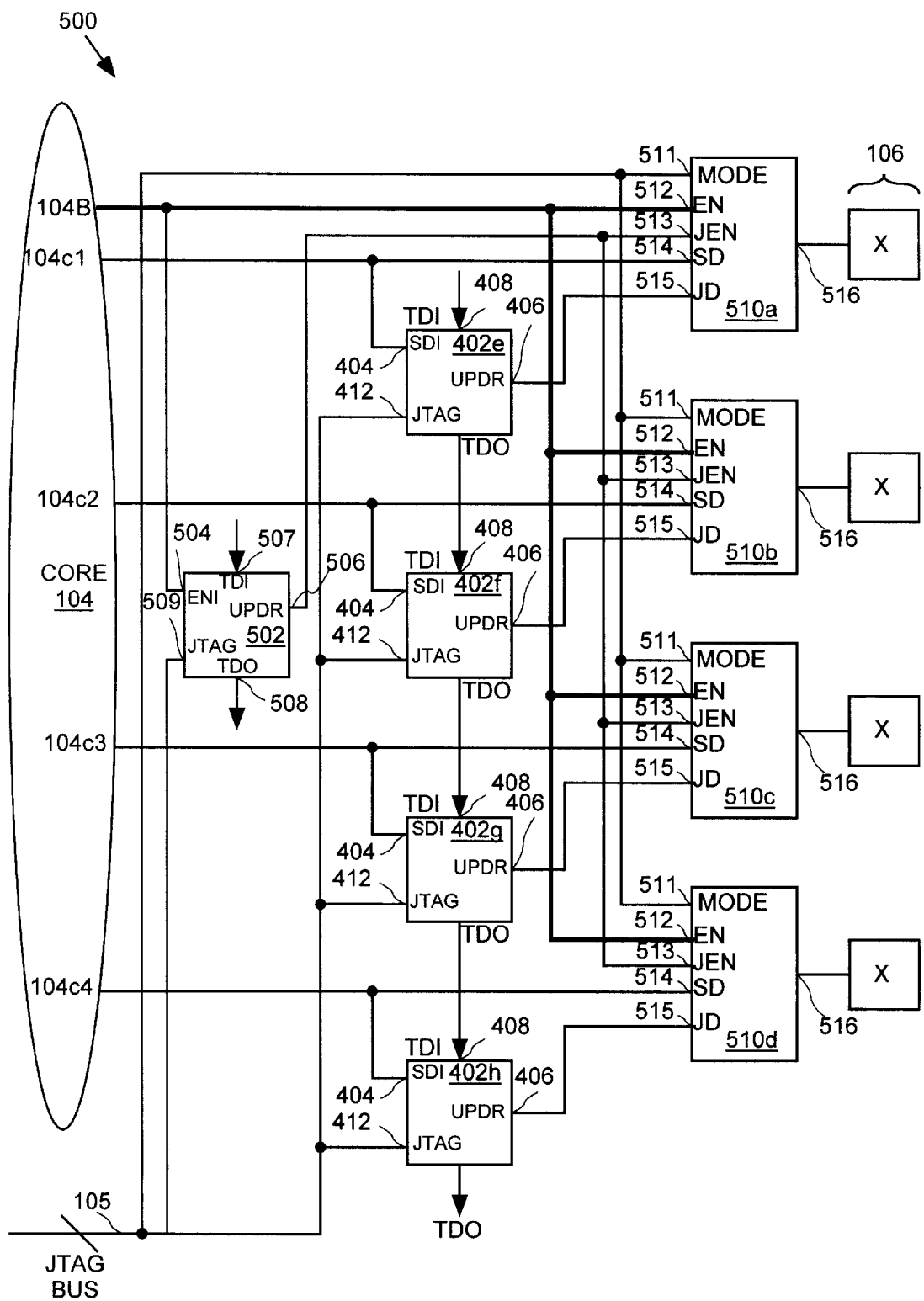
FIG. 5A is a detailed logic block diagram of a four-bit three-state integrated circuit I/O structure including boundary scan cells and output cells in accordance with an embodiment of the present invention.

FIG. 5A is a detailed logic block diagram of a four-bit three-state integrated circuit I/O structure 500 including boundary scan cells and output cells in accordance with an embodiment of the present invention. Four-bit three-state integrated circuit I/O structure 500 includes a control boundary scan cell (CBSC) 502, four BSC's 402e, 402f, 402g, and 402h (FIG. 1B), and four three-state output cells 510a, 510b, 510c, and 510d.

A control input line 504 of CBSC 502 is coupled to receive a system control signal from a system control signal output line 104b of core logic 104. An update output line 506 of CBSC 502 is coupled to provide an update signal to a test control input 513 of each of three-state output cells 510a, 510b, 510c, and 510d. A test data input (TDI) line 507 of CBSC 502 is coupled to receive a test data signal from boundary scan logic (not shown) either directly or via another boundary scan cell. A test data output (TDO) line 508 of CBSC 502 is coupled to provide test data to boundary scan logic (not shown) either directly or via another boundary scan cell. A JTAG input 509 of CBSC 502 is coupled to receive boundary scan control signals via JTAG bus 105 as described below.

A system data input 404 of each of BSC's 402e, 402f, 402g, and 402h is coupled respectively to receive a system data signal from a system data output 104c1, 104c2, 104c3, and 104c4 of core logic 104. An output 406 of each of BSC's 402e, 402f, 402g, and 402h is coupled respectively to an update signal input 515 of three-state output cells 510a, 510b, 510c, and 510d. A test data input (TDI) line 408 of each of BSC's 402e, 402f, 402g, and 402h is coupled to receive a test data signal from boundary scan logic (not shown) either directly or via another boundary scan cell. A test data output (TDO) line 410 of each of BSC's 402e, 402f, 402g, and 402h is coupled to provide test data to boundary scan logic (not shown) either directly or via another boundary scan cell. A JTAG input 412 of each of BSC's 402e, 402f, 402g, and 402h is coupled to receive boundary scan control signals via JTAG bus 105 as described below.

A mode input 511 of each of three-state output cells 510a, 510b, 510c, and 510d is coupled to receive a mode signal via JTAG BUS 105. A system control input 512 of each of three-state output cells 510a, 510b, 510c, and 510d is coupled to receive a system control signal from a system control signal output line 104b of core logic 104. A system data input 514 of each of three-state output cells 510a, 510b, 510c, and 510d is coupled respectively to receive a system data signal from a system data output line 104c1, 104c2, 104c3, and 104c4 of core logic 104.

Figure 5B:
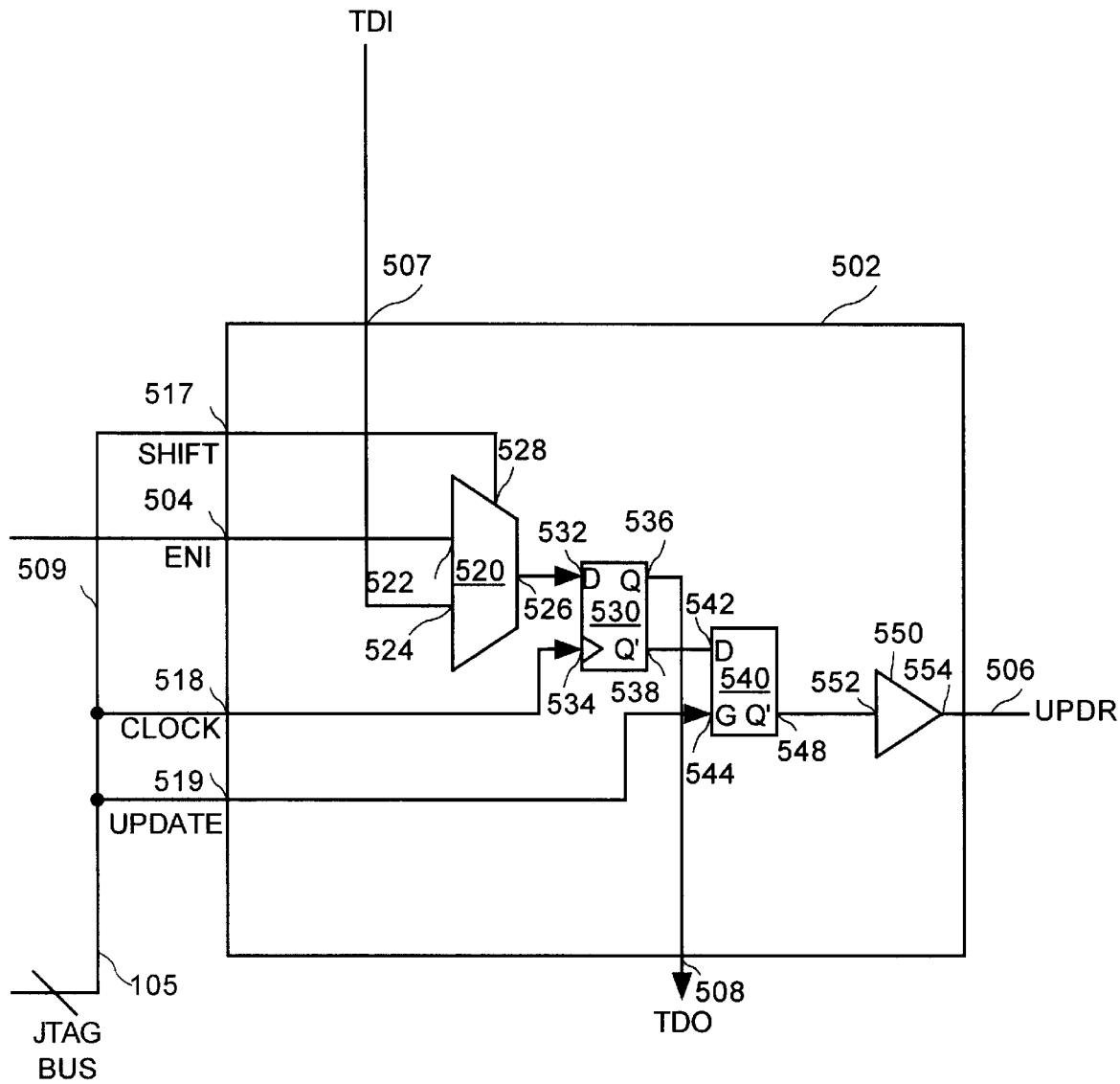
FIG. 5B is a detailed logic block diagram of a control boundary scan cell in accordance with an embodiment of the present invention.

FIG. 5B is a detailed logic block diagram of control boundary scan cell (CBSC) 502 of FIG. 5A in accordance with an embodiment of the present invention. CBSC 502 includes a CBSC shift multiplexer 520, a CBSC clock data register 530, a CBSC update data register 540, and a CBSC output driver 550.

JTAG input 509 of CBSC 502 (FIG. 5A) includes a shift signal input line 517, a clock signal input line 518, and an update signal input line 519. Shift signal input line 517 is coupled to receive a shift signal from boundary scan logic via JTAG bus 105. Clock signal input line 518 is coupled to receive a clock signal from boundary scan logic via JTAG bus 105. Update signal input line 519 is coupled to an update signal from boundary scan logic via JTAG bus 105.

A control input 522 of CBSC shift multiplexer 520 is coupled to receive a system control output signal via control input line 504 of CBSC 502. A test data input 524 of CBSC shift multiplexer 520 is coupled to receive a test data signal from TDI input line 507 of CBSC 502. An output 526 of CBSC shift multiplexer 520 is coupled to provide a signal to a data input 532 of CBSC clock data register 530. A control line 528 of CBSC shift multiplexer 520 is coupled to receive a shift signal via shift signal input line 517 of CBSC 502.

A clock data input 534 of CBSC clock data register 530 is coupled to receive a clock signal via clock signal input 518 of CBSC 502. A normal output 536 of CBSC clock data register 530 is coupled to provide a test data out signal to TDO output line 508 of CBSC 502. An inverted output 538 of CBSC clock data register 530 is coupled to provide a signal to a data input 542 of CBSC update data register 540.

A toggle input 544 of CBSC update data register 540 is coupled to receive an update signal via update signal input line 519 of CBSC 502. An inverted output 548 of CBSC update data register 540 is coupled to provide a signal to input 552 of CBSC output driver 550. An output of CBSC output driver 550 is coupled to provide a CBSC update signal to CBSC update output line 506 of CBSC 502.

With reference back to FIG. 5A, CBSC update output line 506 of CBSC 502 is coupled to provide a CBSC update signal to test control input 513 of each of three-state output cells 510a, 510b, 510c, and 510d. Therefore, CBSC update output line 506 is heavily loaded. CBSC output driver 550 provides adequate power for this loading.

Figure 5C:
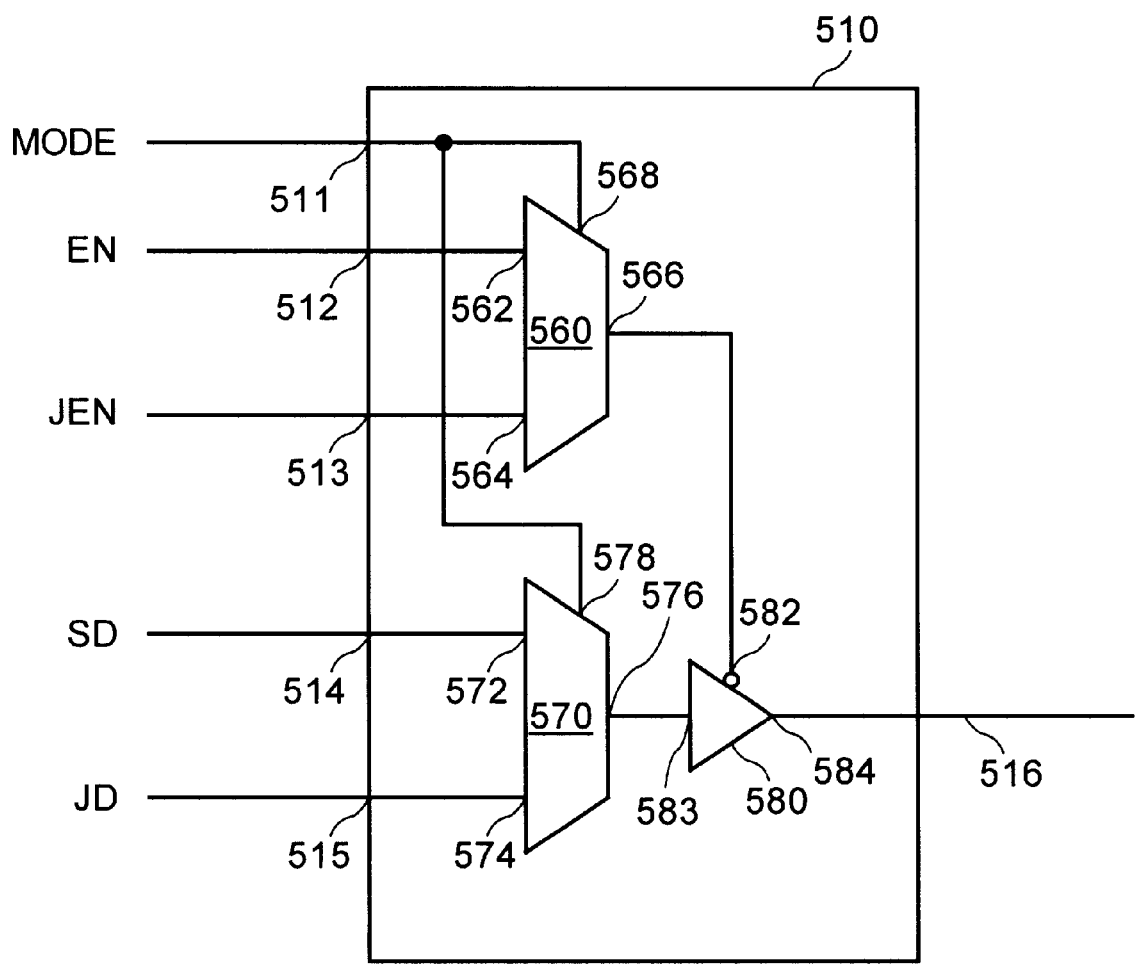
FIG. 5C is a detailed logic block diagram of a three-state output buffer cell in accordance with an embodiment of the present invention.

FIG. 5C is a detailed logic block diagram of three-state output cell 510 in accordance with an embodiment of the present invention. Three-state output cell 510 includes mode input line 511, system control input line 512, test control input line 513, system data signal input line 514, and update signal input line 515. Three-state output cell 510 further includes a three-state output cell mode multiplexer 560, a three-state output cell data multiplexer 570, and a three-state output cell driver 580. A system control signal input 562 of three-state output cell mode multiplexer 560 is coupled to receive a system control signal via system control signal input line 512 of three-state output cell 510. A test control input 564 of three-state output cell mode multiplexer 560 is coupled to receive a test control signal via test control input line 513. An output 566 of three-state output cell mode multiplexer 560 is coupled to provide a signal to a control input 582 of three-state output cell driver 580. A control line 568 of three-state output cell mode multiplexer 560 is coupled to receive a mode signal via mode signal input line 511 of three-state output cell 510.

A system data input 572 of three-state output cell data multiplexer 570 is coupled to receive a system data signal via system data signal input line 514 of three-state output cell 510. An update input 574 of three-state output cell data multiplexer 570 is coupled to receive an update signal via update data signal input 515 of three-state output cell 510.

An output 576 of three-state output cell data multiplexer 570 is coupled to provide a data signal to an input 583 of three-state output cell driver 580. Control line 578 of three-state output cell data multiplexer 570 is coupled to receive mode data via mode signal input line 511 of three-state output cell 560. An output 584 of three-state output cell driver 580 is coupled to provide a signal to data output 516 of three-state output cell 510.

The presence of three-state output cell data multiplexer 570 in three-state output cell 510 provides an advantage over prior art boundary scan test methods in that no splitting of a front end interconnect is required for insertion of boundary scan cells. With reference back to FIG. 5A, there is no bisecting of the front end data interconnects coupling system data input 514 of each three-state output cell 510a, 510b, 510c, and 510d to system data output lines 104c1, 104c2, 104c3, and 104c4 of core logic 104. Therefore, methods according to the present invention eliminate certain problems associated with layout and wire estimation is synthesis. The presence of three-state output cell data multiplexer 570 in three-state output cell 510 provides an advantage over prior art boundary scan test methods in that multiplexer delay may be alleviated.

Figure 6A:
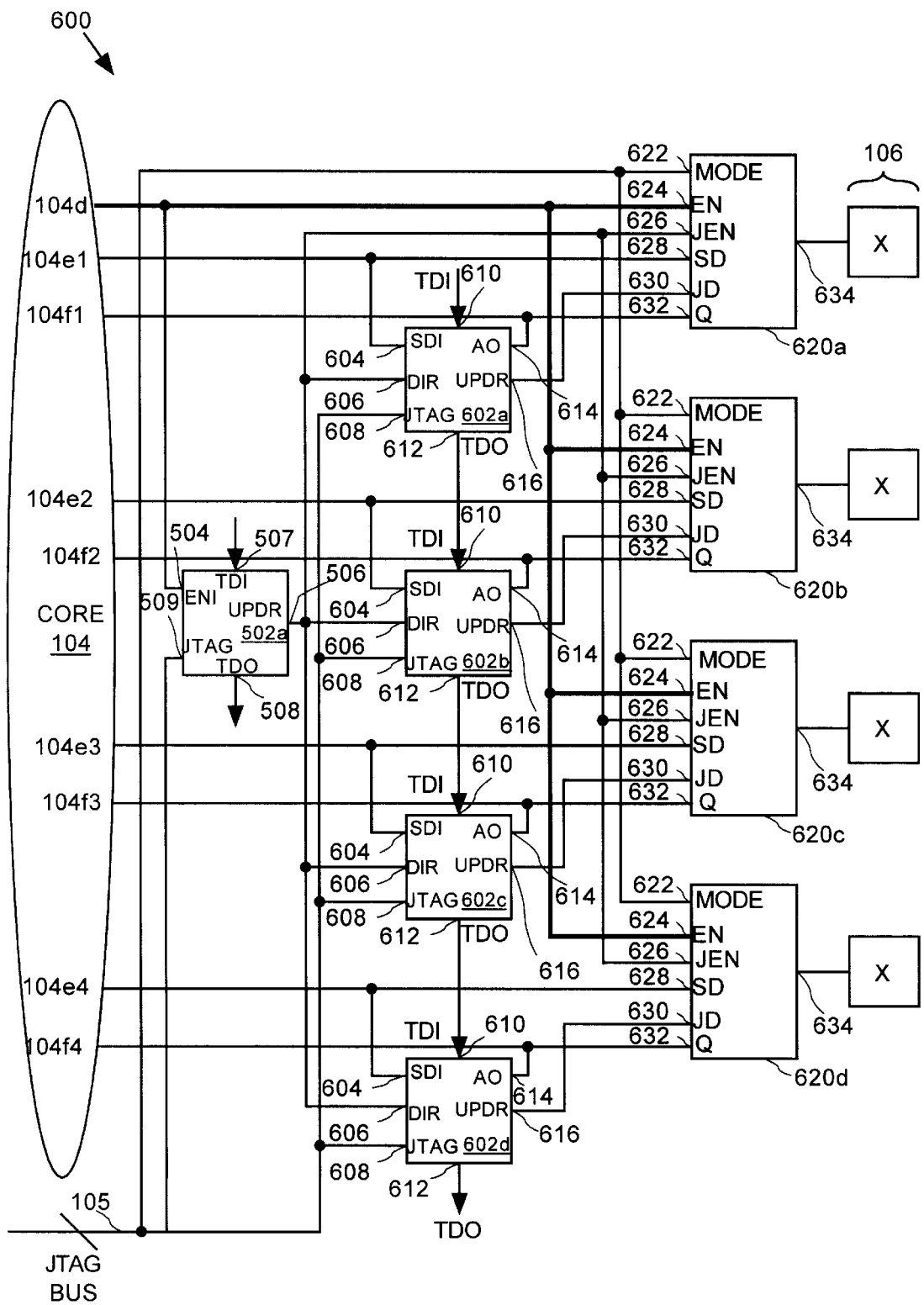
FIG. 6A is a detailed logic block diagram of a four-bit bidirectional integrated circuit I/O structure including boundary scan cells and output cells in accordance with an embodiment of the present invention.

FIG. 6A is a detailed logic block diagram of a four-bit bidirectional integrated circuit I/O structure 600 including boundary scan cells in accordance with an embodiment of the present invention. Four-bit bidirectional integrated circuit I/O structure 600 includes a control boundary scan cell (CBSC) 502a, four bidirectional boundary scan cells (bidirectional BSC's) 602a, 602b, 602c, and 602d and four bidirectional input/output cells (bidirectional I/O cells) 620a, 620b, 620c, and 620d.

A control input signal line 504 of CBSC 502a is coupled to receive a system control signal from a bidirectional system control signal output line 104d of core logic 104. A CBSC update signal output line 506 of CBSC 502a is coupled to provide a CBSC update signal to a test control input 626 of each of bi-directional I/O cells 620a, 620b, 620c, and 620d. A test data input (TDI) line 507 of CBSC 502a is coupled to receive a test data signal from boundary scan logic (not shown) either directly or via another boundary scan cell. A test data output (TDO) line 508 of CBSC 502a is coupled to provide a test data signal to boundary scan logic (not shown) either directly or via another boundary scan cell. A JTAG input 509 of CBSC 502a is coupled to receive boundary scan control signals via JTAG bus 105 as described below.

A system data input signal line 604 of each of bidirectional BSC's 602a, 602b, 602c, and 602d is coupled respectively to receive a system data signal from a system data signal output line 104e1, 104e2, 104e3, and 104e4 of core logic 104. A direction control input line 606 of bidirectional bi-directional BSC's 602a, 602b, 602c, and 602d is coupled respectively to receive a direction control signal from CBSC update signal output line 506 of CBSC 502a. A JTAG input 608 of each of bidirectional BSC's 602a, 602b, 602c, and 602d is coupled to receive boundary scan control signals via JTAG bus 105 as described below. A test data input (TDI) line 610 of each of bidirectional BSC's 602a, 602b, 602c, and 602d is coupled to receive a test data signal from boundary scan logic either directly or via another boundary scan cell. A test data output (TDO) line 612 of each of bidirectional BSC's 602a, 602b, 602c, and 602d is coupled to provide a test data signal to boundary scan logic either directly or via another boundary scan cell. A system data received signal input 614 of each of bidirectional BSC's 602a, 602b, 602c, and 602d is coupled to receive a system data received signal respectively from system data received output 632 of bi-directional I/O cell 620a, 620b, 620c, and 620d. A bidirectional BSC update signal output 616 of each of bidirectional BSC's 602a, 602b, 602c, and 602d is coupled to provide a bidirectional BSC update signal respectively to an update input 630 of bi-directional I/O cells 620a, 620b, 620c, and 620d.

A mode signal input 622 of each of bi-directional I/O cells 620a, 620b, 620c, and 620d is coupled to receive a mode signal via JTAG BUS 105. A system control input 624 of each of bi-directional I/O cells 620a, 620b, 620c, and 620d is coupled to receive a control signal from system control data output line 104d of core logic 104. A system data input 628 of each of bi-directional I/O cells 620a, 620b, 620c, and 620d is coupled respectively to receive a system data signal from a system data signal output line 104e1, 104e2, 104e3, and 104e4 of core logic 104. An input/output 634 of each bidirectional I/O cell 620a, 620b, 620c, and 620d is coupled to an I/O pin of I/O pins 106.

Figure 6B:
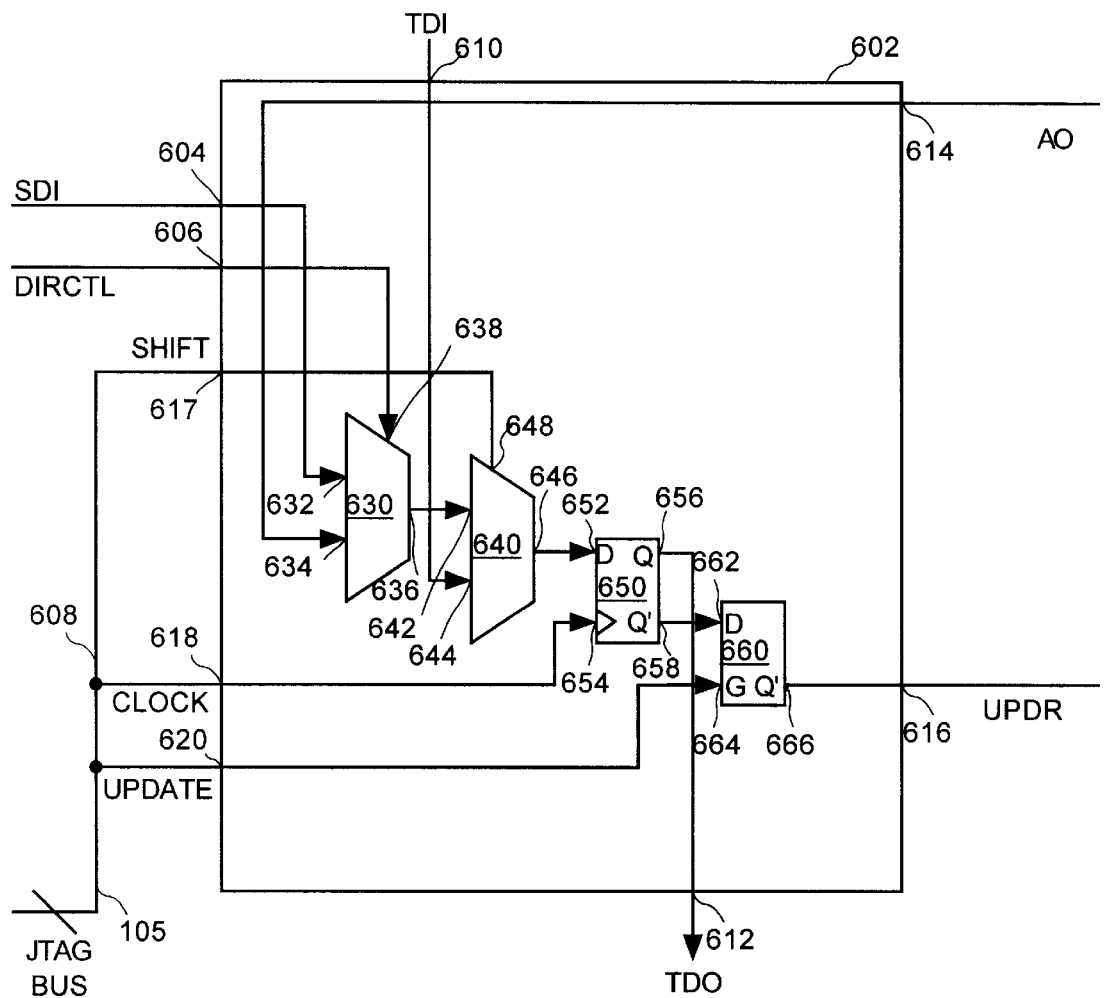
FIG. 6B is a detailed logic block diagram of a bidirectional output boundary scan cell in acyrdance with an embodiment of the present invention.

FIG. 6B is a detailed logic block diagram of a bidirectional boundary scan cell (bidirectional BSC) 602 in accordance with an embodiment of the present invention. Bidirectional BSC 602 includes system data signal input line 604, direction control input line 606, JTAG input line 608, test data input (TDI) line 610, test data output (TDO) line 612, system data received input line 614, and update signal output line 616. JTAG input 608 of bidirectional BSC 602 includes a shift signal input line 617, a clock signal input line 618, and an update signal input line 620. Shift signal input line 617 is coupled to receive a shift data signal from boundary scan logic via JTAG bus 105. Clock signal input line 618 is coupled to receive a clock signal from boundary scan logic via JTAG bus 105. Update signal input line 620 is coupled to receive a control update signal from boundary scan logic via JTAG bus 105.

Bi-directional BSC 602 includes a direction control multiplexer 630. A system data input 632 of direction control multiplexer 630 is coupled to receive a system data signal via system data signal input line 604. A system data received input 634 of direction control multiplexer 630 is coupled to receive a system data received signal via system data received signal input 614 of bi-directional BSC 602. An output 636 of direction control multiplexer 630 is coupled to provide a data signal to a data input 642 of shift multiplexer 640. A control line 638 of direction control multiplexer 630 is coupled to receive a direction control signal via directional control input line 606 of bidirectional BSC 602. A test data input 644 of bi-directional shift multiplexer 640 is coupled to receive a test data signal via TDI input line 610 of bi-directional BSC 602. An output 646 of bi-directional shift multiplexer 640 is coupled to provide a signal to a data input 652 of bi-directional clock data register 650. A control line 648 of bi-directional shift multiplexer 640 is coupled to receive a shift signal via shift signal input line 617 of bi-directional BSC 602.

A clock input 654 of bi-directional clock data register 650 is coupled to receive a clock signal via clock signal input line 618 of bi-directional BSC 602. A normal output 656 of bi-directional clock data register 650 is coupled to provide a test data out signal to TDO output line 612 of bi-directional BSC 602. An inverted output 658 of bi-directional clock data register 650 is coupled to provide a signal to a data input 662 of bi-directional update data register 660. A toggle (G) input 664 of bi-directional update data register 660 is coupled to receive a control update signal via control update signal input line 620 of bi-directional BSC 602. An inverted output 666 of bi-directional update data register 660 is coupled to provide a bidirectional BSC update signal via bidirectional BSC update signal output line 616 of bidirectional BSC 602.

Figure 7:
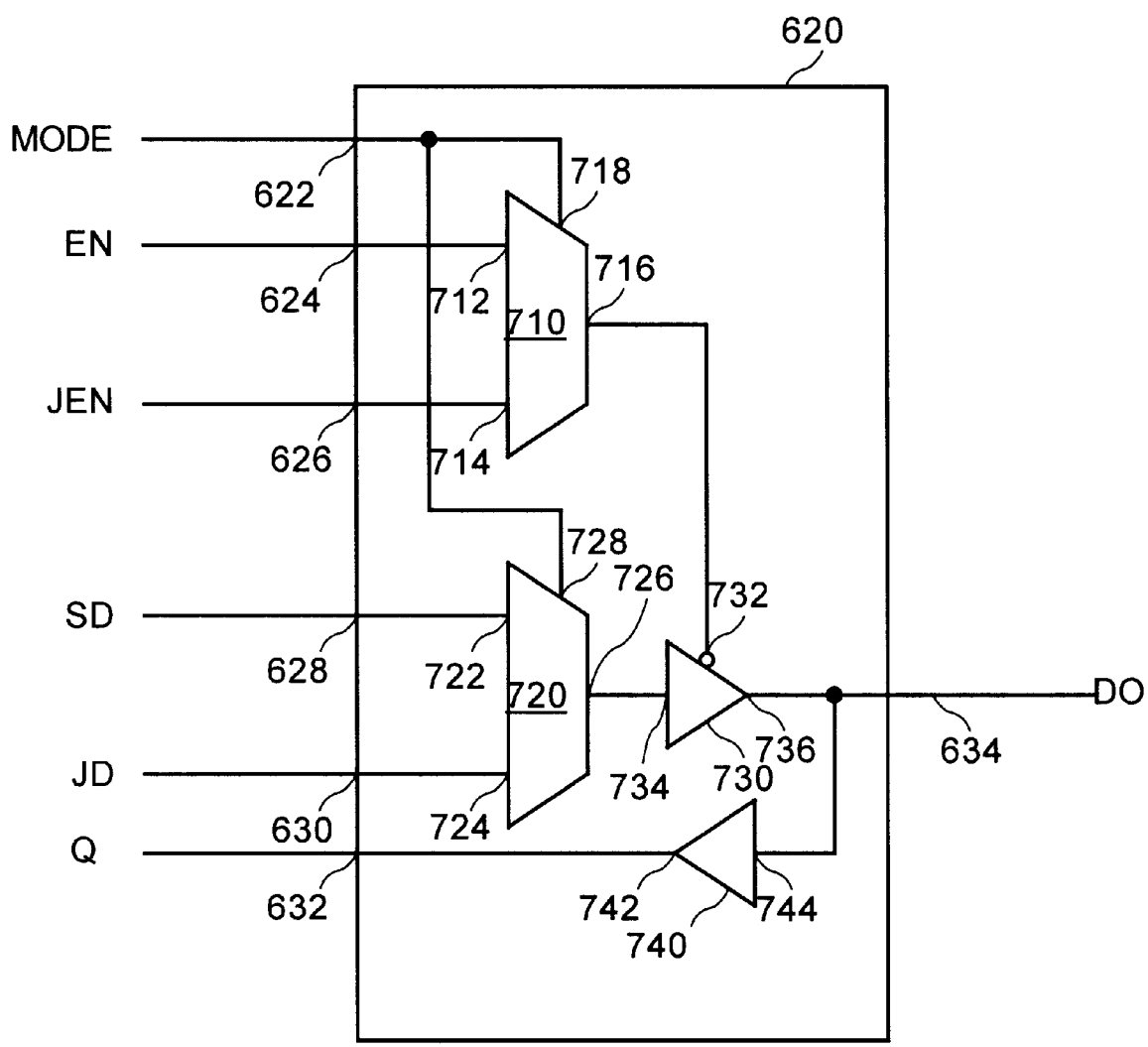
FIG. 7 is a detailed logic block diagram of a bidirectional output buffer cell in accordance with an embodiment of the present invention.

FIG. 7 is a logic block diagram of bidirectional I/O cell 620 in accordance with an embodiment of the present invention. Bidirectional I/O cell 620 includes mode signal input line 622, system control input line 624, test control input line 626, system data input line 628, test data input line 630, and system data received output line 632, and input/output line 634.

Bidirectional I/O cell 620 also includes a bidirectional I/O cell control multiplexer 710, a bidirectional I/O cell data multiplexer 720, a bidirectional I/O cell output driver 730, and a bidirectional I/O cell input driver 740. A system control input 712 of bidirectional I/O control multiplexer 710 is coupled to receive a system control signal via system control input 624 of bidirectional I/O cell 620. A test control input 714 of bidirectional I/O control multiplexer 710 is coupled to receive a test control signal via test control input line 626 of bidirectional I/O cell 620. An output 716 of bidirectional I/O control multiplexer 710 is coupled to provide a signal to a control line 732 of bidirectional I/O cell output driver 730. A control line 718 of bidirectional I/O control multiplexer 710 is coupled to receive a mode signal via mode signal input line 622 of bidirectional I/O cell 620.

A system data input 722 of bidirectional I/O cell data multiplexer 720 is coupled to receive a system data signal via system data signal input line 628 of bidirectional I/O cell 620. A test data signal input 724 of bidirectional I/O cell data multiplexer 720 is coupled to receive a test data signal via test data signal input line 630 of bidirectional I/O cell 620. An output 726 of bidirectional I/O cell data multiplexer 720 is coupled to provide a signal to an input 734 of bidirectional I/O cell output driver 730. A control line 728 of bidirectional I/O cell data multiplexer 720 is coupled to receive a mode signal via mode signal input line 622 of bidirectional I/O cell 620. An output 736 of bidirectional I/O cell output driver 730 is coupled to provide an output signal to input/output 634 of bidirectional I/O cell 620. An output 742 of bidirectional I/O cell input driver 740 is coupled to provide a system data received signal to system data received output 632 of bidirectional I/O cell 620. An input 744 of bidirectional I/O cell input driver 740 is coupled to receive data via input/output 634 of bidirectional I/O cell 620.

The presence of bidirectional I/O cell data multiplexer 720 in bidirectional I/O cell 620 provides an advantage over prior art boundary scan test methods in that no splitting of a front end interconnect is required for insertion of boundary scan cells. With reference back to FIG. 6A, there is no bisecting of the front end data interconnects coupling system data input 628 of each bidirectional I/O cell 620a, 6200b, 620c, and 620d to system data output lines 104e1, 104e2, 104e3, and 104e4 of core logic 104. Therefore, methods according to the present invention eliminate certain problems associated with layout and wire estimation is synthesis. The presence of bidirectional I/O cell data multiplexer 720 in bidirectional I/O cell 620 provides an advantage over prior art boundary scan test methods in that multiplexer delay may be alleviated.

While this invention has been described in terms of several preferred embodiments, there are alterations, permutations, and equivalents which fall within the scope of this invention. It should also be noted that there are may alternative ways of implementing both the process and apparatus of the present invention. It is therefore intended that the following appended claims be interpreted as including all such alterations, permutations, and equivalents as fall within the true spirit and scope of the present invention.

What is claimed is:

1. An integrated circuit with boundary scan comprising:
   core circuitry having at least one system data output line;
   boundary scan logic having a test data line, a shift signal line, and a mode signal line,
   at least one output boundary scan cell having a boundary scan multiplexer having a control input coupled to said shift signal line and having a first input coupled to receive a system data signal and having a second input coupled to said test data line, said boundary scan cell further having a first output data register having an input coupled to an output of said boundary scan multiplexer; and
   at least one output cell including an output data multiplexer having a control input coupled to said mode signal line and having as inputs said system data output line and an output of said first output data register, said output cell further including an output buffer coupling an output of said out put data multiplexer to a pin of said integrated circuit,
   whereby said at least one output boundary scan cell and said at least one output cell are separate from each other.

2. The integrated circuit with boundary scan of claim 1 wherein said system data signal is provided by said at least one system data output line of said core circuitry.

3. The integrated circuit with boundary scan of claim 1 further comprising:
   at least one system control output line provided by said core circuitry,
   at least one control boundary scan cell having,
      a control boundary scan multiplexer having a control input coupled to said shift signal line and having a first input coupled to said at least one system control output line and having a second input coupled to said test data line,
      a first control data register having an input coupled to an output of said control boundary scan multiplexer,
      a second control data register having an input coupled to an inverted output of said first control data register, and
      a control driver having an input coupled to an inverted output of said second control data register;
   wherein said at least one output cell further includes an output control multiplexer having a control input coupled to said mode signal line and having as inputs said system control signal line and an output of said control driver and wherein said output buffer includes a control input coupled to an output of said output control multiplexer, and
   wherein said system data signal is provided by said at least one system data output line.

4. The integrated circuit with boundary scan of claim 1 further comprising:
   at least one system control output line provided by said core circuitry,
   at least one control boundary scan cell having,
      a control boundary scan multiplexer having a control input coupled to said shift signal line and having a first input coupled to said at least one system control output line and having a second input coupled to said test data line,
      a first control data register having an input coupled to an output of said control boundary scan multiplexer,
      a second control data register having an input coupled to an inverted output of said first control data register, and
      a control driver having an input coupled to an inverted output of said second control data register;
   wherein said output boundary scan cell is a bidirectional boundary scan cell further including a direction control multiplexer having a control input coupled to an output of said control driver and having a first input coupled to said at least one system data output line and having a second input coupled to receive a system data input signal received from said pin of said integrated circuit, and wherein an output of said direction control multiplexer provides said system data signal which is received by said first input of said output boundary scan multiplexer; and
   wherein said at least one output cell further includes,
      an output control multiplexer having a control input coupled to said mode signal line and having as inputs said system control signal line and an output of said control driver,
      an input buffer having an input coupled to said pin of said integrated circuit, and
      wherein said output buffer includes a control input coupled to an output of said output control multiplexer.

5. The integrated circuit with boundary scan of claim 1 wherein said at least one output boundary scan cell further includes a second output data register having a first input coupled to receive said output of said first output data register.

6. The integrated circuit with boundary scan of claim 5 wherein second output data register includes a second input coupled to receive an update signal from said boundary scan logic.

7. The integrated circuit with boundary scan of claim 1 wherein said first output data register includes a second input coupled to receive a clock signal from said boundary scan logic.

8. A method for making an integrated circuit with boundary scan comprising the steps of:
   providing core circuitry for producing at least one system output data signal;

providing boundary scan logic for producing a test data signal, a shift signal, and a mode signal;

providing at least one boundary scan cell having an output boundary scan multiplexer for multiplexing a system data signal and said test data signal in response to said shift signal, said boundary scan cell further having a first output data register receptive to an output of said output boundary scan multiplexer; and providing separately from said at least one boundary scan cell at least one output cell including an output data multiplexer for multiplexing said system output data signal and an output of said first output data register in response to said mode signal, said output cell further having an output buffer coupling an output of said output data multiplexer to a pin of said integrated circuit.

9. The method for making an integrated circuit with boundary scan of claim 8 wherein said system data signal is provided by said at least one system data output line.

10. The method for making an integrated circuit with boundary scan of claim 8 further comprising the steps of providing core circuitry for producing at least one system control output signal, providing at least one control boundary scan cell having,
a control boundary scan multiplexer for multiplexing said at least one system control output signal and said test data signal in response to said shift signal,
a first control data register receptive to an output of said control boundary scan multiplexer,
a second control data register receptive to an inverted output of said first control data register, and
a control driver for driving an inverted output of said second control data register, and wherein said at least one output cell further includes an output control multiplexer for multiplexing said system control output signal and an output of said control driver in response to said mode signal and wherein said output buffer is controlled by an output of said output control multiplexer; and wherein said system data signal is provided by said at least one system data output signal.

11. The method for making an integrated circuit with boundary scan of claim 8 further comprising the steps of providing core circuitry for producing at least one system control output signal, providing at least one control boundary scan cell having,
a control boundary scan multiplexer for multiplexing said at least one system control output signal and said test data signal in response to said shift signal,
a first control data register receptive to an output of said control boundary scan multiplexer,
a second control data register receptive to an inverted output of said first control data register, and
a control driver for driving an inverted output of said second control data register, wherein said output boundary scan cell is a bidirectional boundary scan cell further including a direction control multiplexer for multiplexing said at least one system data output signal and a system data input signal received from said pin of said integrated circuit in response to an output of said control driver and wherein an output of said direction control multiplexer provides said system data signal which is multiplexed by said output boundary scan multiplexer;

wherein said at least one output cell further includes;

an output control multiplexer for multiplexing said system control signal and an output of said control driver in response to said mode signal, an input buffer for buffering said system data input signal received from said pin of said integrated circuit, and wherein said output buffer is controlled by an output of said output control multiplexer.

12. The method for making an integrated circuit with boundary scan of claim 8 wherein said at least one output boundary scan cell further includes a second output data register receptive to said output of said first output data register and providing a buffered signal to said output data multiplexer of said at least one output cell.

13. The method for making an integrated circuit with boundary scan of claim 12 wherein said second output data register is receptive to an update signal from said boundary scan logic.

14. The method for making an integrated circuit with boundary scan of claim 8 wherein said first output data register is receptive to a clock signal from said boundary scan logic.

15. An integrated circuit with boundary scan comprising:

core circuitry means for producing at least one system data output;

boundary scan means for producing a test data signal, a shift signal, and a mode signal;

at least one output boundary scan cell means including,
means for multiplexing a system data signal and said test data signal in response to said shift signal, and
first data storage means for storing a multiplexed output; and at least one output cell means including,
means for multiplexing said system output data signal and an output of said first data storage means in response to said mode signal, and output buffer means for coupling a buffered, multiplexed output to a pin of said integrated circuit.

16. The integrated circuit with boundary scan of claim 15 wherein said system data signal is provided by said at least one system data output signal.

17. The integrated circuit with boundary scan of claim 15 further comprising:

core circuitry means for producing at least one system control output signal;

at least one control boundary scan cell means including,
means for multiplexing said at least one system control output signal and said test data signal in response to said shift signal,
means for storing a multiplexed output, and
driver means for driving a multiplexed stored output;

wherein said at least one output cell means further includes,
means for multiplexing said system control signal and an output of said driver means in response to said mode signal,
and wherein said output buffer means includes control means receptive to an output of said means for multiplexing said system control signal and said output of said driver means in response to said mode signal; and wherein said system data signal is provided by said at least one system data output line.

18. The integrated circuit with boundary scan of claim 15 further comprising:

core circuitry means for producing at least one system control output signal;

at least one control boundary scan cell means including,
means for multiplexing said at least one system control output signal and said test data signal in response to said shift signal,
first storage means for storing a multiplexed output,
second storage means for storing an output of said first storage means, and
control driver means for driving an output of said second storage means, wherein said output boundary scan cell means includes,
direction control means for multiplexing said at least one system data output signal and a system data input signal received from said pin of said integrated circuit in response to an output of said control driver means,
and wherein an output of said direction control means provides said system data signal which is multiplexed by said means for multiplexing of said output boundary scan cell means, wherein said at least one output cell means further includes,
an output control means for multiplexing said system control signal and an output of said control driver means in response to said mode signal,
an input buffer means for buffering an input signal received from said pin of said integrated circuit, and wherein said output buffer means includes a control means responsive to an output of said output control means for multiplexing.

19. The integrated circuit with boundary scan of claim 15 wherein said at least one output boundary scan cell means further includes a second data storage means for storing said output of said first data storage means.

20. The integrated circuit with boundary scan of claim 15 wherein said first output data storage means is responsive to a clock signal from said boundary scan logic means.

* * * * *